US008658263B2

(12) United States Patent
Kawasumi et al.

(10) Patent No.: US 8,658,263 B2
(45) Date of Patent: Feb. 25, 2014

(54) SHAPE-RETAINING FILM, PROCESS FOR PRODUCING SAME, LAMINATE FOR PACKAGING, PACKAGING MATERIAL AND PROCESS FOR PRODUCING SAME, SHAPE-RETAINING FIBER, AND ANISOTROPIC HEAT-CONDUCTIVE FILM

(75) Inventors: Tamio Kawasumi, Chiba (JP); Michio Eriguchi, Chiba (JP); Shigeo Nishikawa, Chiba (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 0 days.

(21) Appl. No.: 13/695,195

(22) PCT Filed: Apr. 27, 2011

(86) PCT No.: PCT/JP2011/002487
§ 371 (c)(1),
(2), (4) Date: Oct. 29, 2012

(87) PCT Pub. No.: WO2011/135860
PCT Pub. Date: Nov. 3, 2011

(65) Prior Publication Data
US 2013/0045347 A1    Feb. 21, 2013

(30) Foreign Application Priority Data

| Apr. 30, 2010 | (JP) | 2010-105362 |
| Apr. 30, 2010 | (JP) | 2010-105363 |
| May 27, 2010 | (JP) | 2010-121944 |
| Jun. 15, 2010 | (JP) | 2010-136326 |
| Jun. 15, 2010 | (JP) | 2010-136443 |
| Feb. 10, 2011 | (JP) | 2011-027465 |

(51) Int. Cl.
*B29D 22/00* (2006.01)

(52) U.S. Cl.
USPC .............. 428/35.2; 156/217; 264/291

(58) Field of Classification Search
USPC ............................... 428/35.2, 109, 110
See application file for complete search history.

(56) References Cited

U.S. PATENT DOCUMENTS 6,186,185 B1    2/2001    Krokar

FOREIGN PATENT DOCUMENTS

| JP | 2-166755 A | 6/1990 |
| JP | 2-196453 A | 8/1990 |
| JP | 6-155517 A | 6/1994 |
| JP | 7-014950 A | 1/1995 |
| JP | 11-207813 A | 8/1999 |

(Continued)

OTHER PUBLICATIONS

Machine English Translation of JP 2007-153361.

(Continued)

*Primary Examiner* — N. Edwards
(74) *Attorney, Agent, or Firm* — Buchanan Ingersoll & Rooney PC

(57) ABSTRACT

Provided are a shape-retaining film which has excellent adhesion to inks and other functional layers while retaining high shape-retaining properties and a process for producing the shape-retaining film. The shape-retaining film comprises an ethylene homopolymer or an ethylene/a-olefin copolymer having a C3-6 a-olefin content less than 2 wt. %, the ethylene homopolymer or copolymer having a density of 950 kg/m3 or higher and a weight-average molecular weight (Mw)/number-average molecular weight (Mn) ratio of 5-20. The film has a tensile elasticity modulus of 6-50 GPa and has either an angle of recovery from 90 bending of 8 or less or an angle of recovery from 180 bending of 65 or less.

10 Claims, 19 Drawing Sheets

(56) References Cited

FOREIGN PATENT DOCUMENTS

| | | |
|---|---|---|
| JP | 2001-160607 A | 6/2001 |
| JP | 2001-513855 | 9/2001 |
| JP | 2002-046170 A | 2/2002 |
| JP | 2003-278026 A | 10/2003 |
| JP | 2004-181878 A | 7/2004 |
| JP | 2005-035148 A | 2/2005 |
| JP | 2005-074711 A | 3/2005 |
| JP | 2005-088903 A | 4/2005 |
| JP | 2006-089579 a | 4/2006 |
| JP | 2007-153361 A | 6/2007 |
| JP | 2009-001311 A | 1/2009 |
| JP | 2009-030219 A | 2/2009 |
| JP | 2009-233904 a | 10/2009 |
| WO | WO 98/39507 | 9/1998 |

OTHER PUBLICATIONS

Machine English Translation of JP 2003-278026.
Machine translation of JP2004-181878.
Machine translation of JP 2005-088903.
Machine translation of JP 6-155517.
Machine translation of JP 2001-160607.
Machine translation of JP 2009-233904.
Machine translation of JP 11-207813.
Machine translation of JP 2002-046170.
Machine translation of JP 2009-001311.
Machine translation of JP 2009-030219.
Machine translation of JP 07-014950.

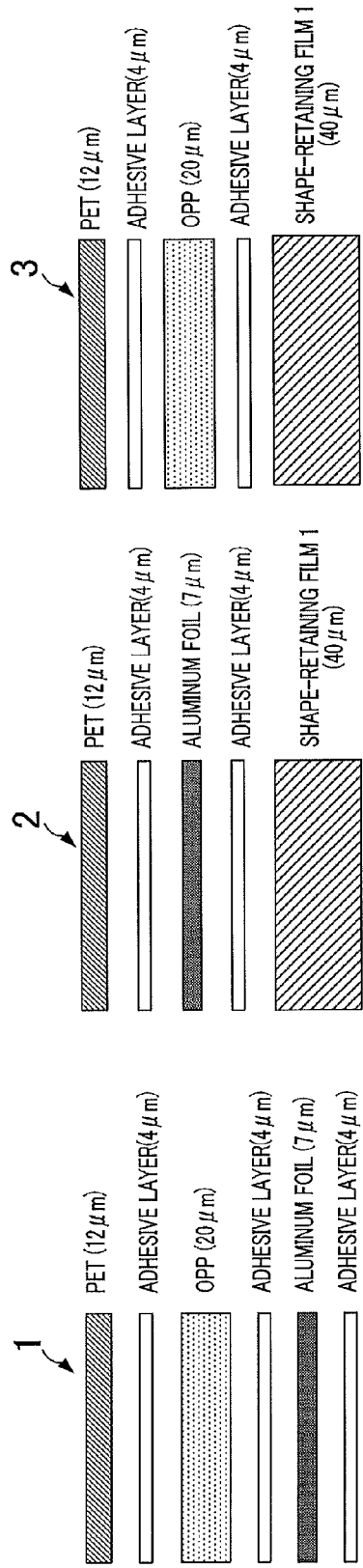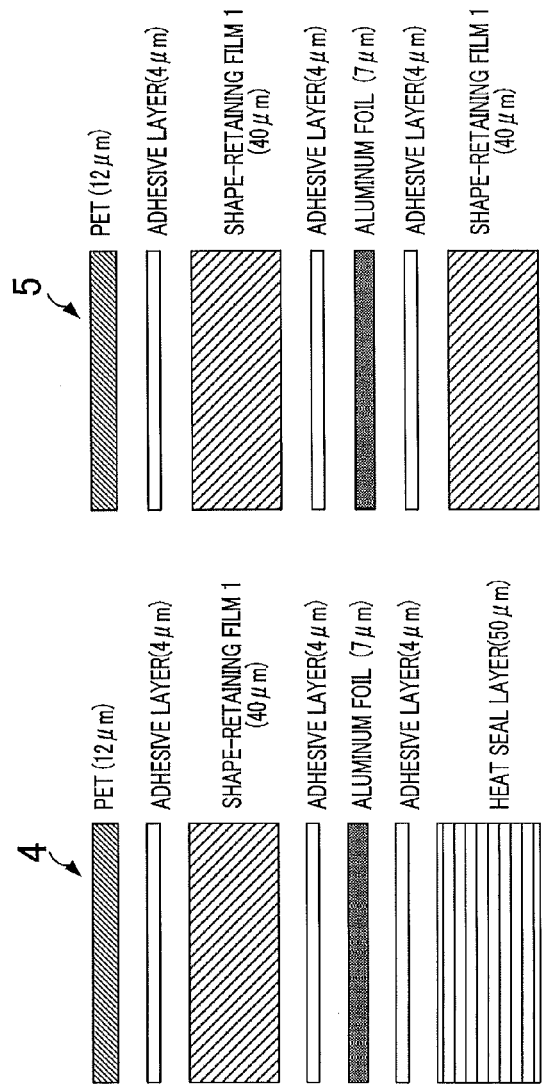

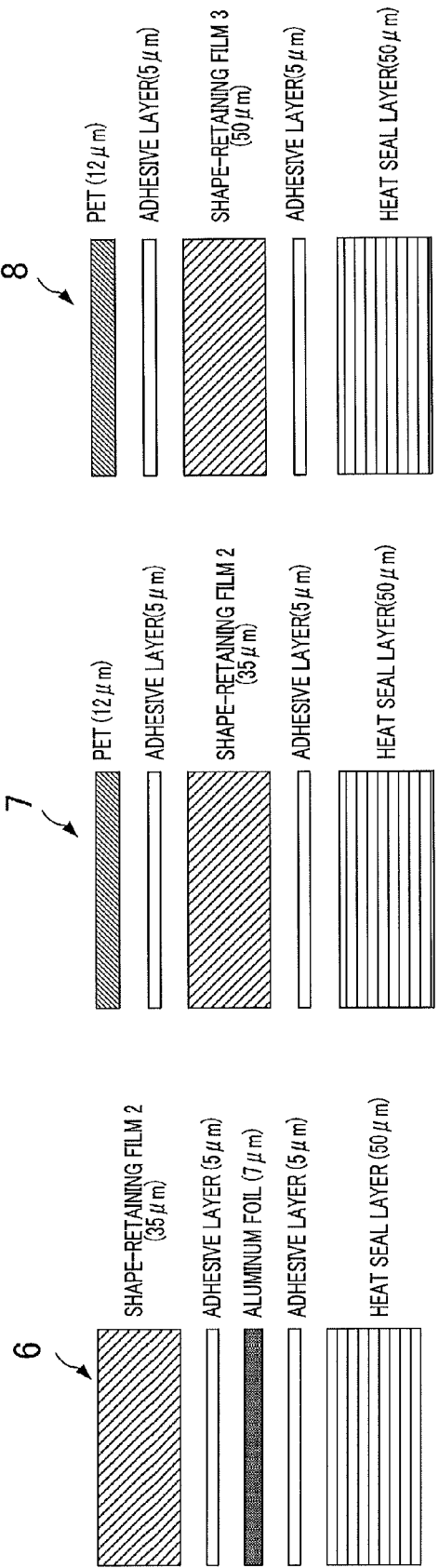
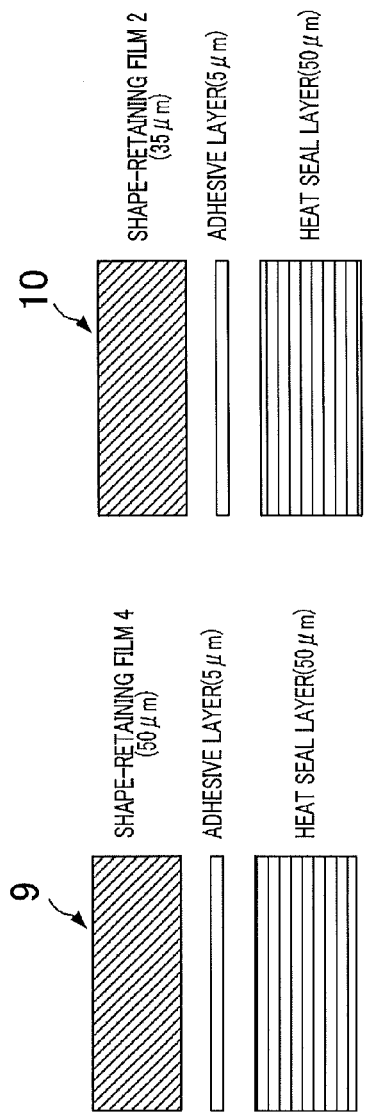
FIG.11(A) FIG.11(B) FIG.11(C) FIG.11(D) FIG.11(E)

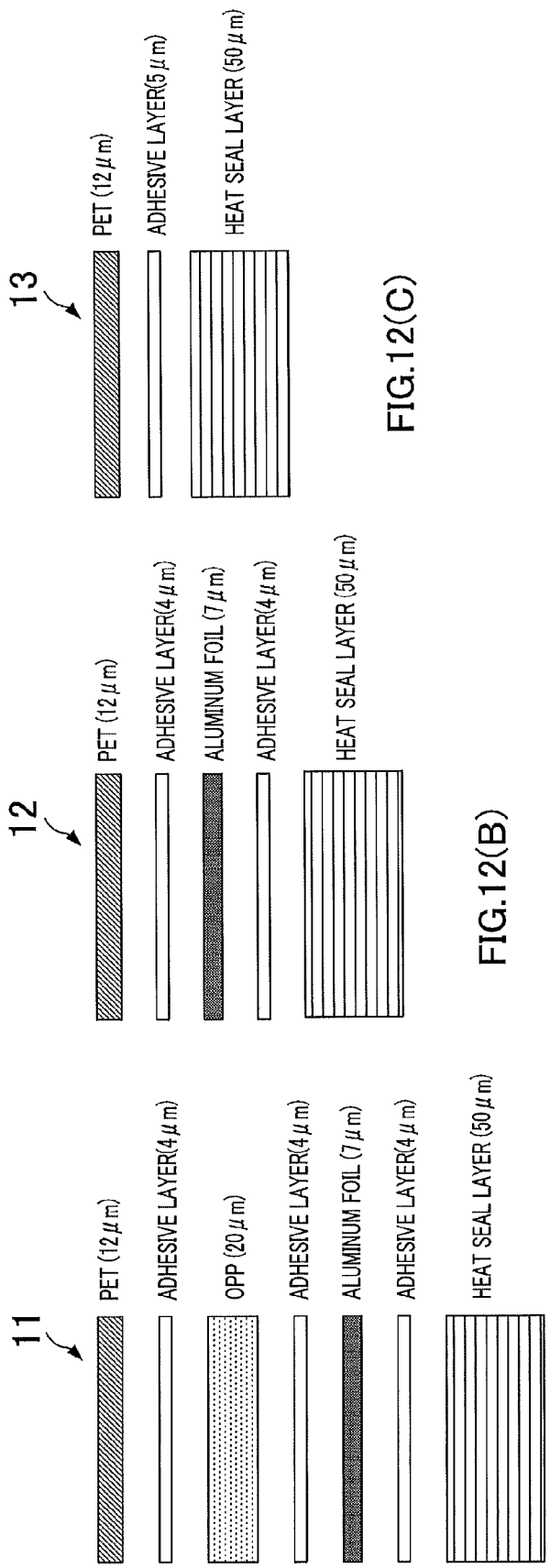

SHAPE-RETAINING FILM, PROCESS FOR PRODUCING SAME, LAMINATE FOR PACKAGING, PACKAGING MATERIAL AND PROCESS FOR PRODUCING SAME, SHAPE-RETAINING FIBER, AND ANISOTROPIC HEAT-CONDUCTIVE FILM

TECHNICAL FIELD

The present invention relates to shape-retaining films, processes for producing the same, packaging laminate films, packaging materials and processes for producing the same, shape-retaining fibers, and anisotropic heat-conductive films.

BACKGROUND ART

Containers for foods such as cup noodles and puddings are required to have shape retainability—an ability with which they can retain the shape in the lid open state and the shape in the lid closed state. Aluminum and other metals have heretofore been employed as the lid materials for such food containers. However, studies have been made for shape-retaining resin films because of disadvantages of aluminum, such as time-consuming separate disposal and inapplicability to products for microwave oven use, where water or other liquid is poured in the container for cooking.

As the shape-retaining resin films, uniaxially-stretched polyethylene films have been proposed (see, e.g., Patent Literature 1). In addition to usage as shape-retaining films, it is recognized that uniaxially-stretched polyethylene films are used as easy-tearing films for food packaging (see e.g., Patent Literature 2). In some applications, additional functional layers such as printable films and/or heat sealing layers are laminated onto these container lid materials and packaging films.

Packaging bags for powdery foods, retort foods, snacks and other foods as well as packaging bags for detergents and other agents are required to exhibit such shape retainability that allows for content removal in a self-standing position or air-tight sealing by simply folding over on itself at the open end.

As the shape-retaining bags, packaging bags have been proposed that include aluminum foil serving as a shape retainer. For example, gusset bags have been proposed that include a multilayer film in which aluminum foil is sandwiched by multiple resin layers (see Patent Literature 3). Gusset bags that exhibit enhanced shape retainability at the open end have also been proposed in which plastically deformable thin bars are incorporated into the sides of the bag that fold in to form a "gusset" (see Patent Literature 4).

As shape-retaining resin fibers, resin fibers have been proposed that are prepared by micro-slitting of uniaxially-stretched polyethylene films having a glossy layer laminated thereon (see Patent Literature 5).

As structures for diffusing heat generated from such heat sources as electric parts, structures for reducing thermal contact resistance have been known in which a heat-conductive silicone grease or a flexible, sheet-shaped heat-conductive silicone rubber (heat-conductive sheet) is disposed between the heat source and heat dissipator such as a heat sink.

Heat-conductive sheets that exhibit enhanced thermal conductivity have been known in which metals, ceramics, carbon fibers, etc., that exhibit high thermal conductivity are incorporated into the sheet. For example, heat-transfer sheets have been proposed that are prepared by mixing silicone gel with metal oxide or boron nitride to provide grooves on their surface (see, e.g., Patent Literature 6). The heat-transfer sheets are claimed to be able to absorb thermal expansion by being deformed upon pressure bonding between the heat-generating elements and heat dissipator.

Also proposed are heat-conductive sheets with enhanced strength for good operability. Examples include heat-conductive sheets that include a composite layer of a strength-retaining layer composed of silicone rubber mixed with heat-conductive filler, and a deformable layer composed of flexible silicone gel containing heat-conductive filler; and low-hardness silicone rubber sheets that include a silicone rubber layer and a reinforcement layer (see, e.g., Patent Literatures 7 and 8).

On the other hand, in electronic devices that are being increasingly downsized and slimmed down, e.g., laptop computers and cellular phones, due to limited space directly above heat sources such as CPU and ICs, heat diffusion needs to be effected by providing a heat dissipator at a position remote from the heat sources. In order to allow heat to be conducted from the heat sources as far as to the heat dissipator, they are coupled together with a heat-conductive sheet.

CITATION LIST

Patent Literature

[PTL 1] Japanese Patent Application Laid-Open No. 2007-153361
[PTL 2] Japanese Patent Application Laid-Open No. 2004-181878
[PTL 3] Japanese Patent Application Laid-Open No. 2009-001311
[PTL 4] Japanese Patent Application Laid-Open No. 2005-088903
[PTL 5] Japanese Patent Application Laid-Open No. 2009-30219
[PTL 6] Japanese Patent Application Laid-Open No. 02-166755
[PTL 7] Japanese Patent Application Laid-Open No. 02-196453
[PTL 8] Japanese Patent Application Laid-Open No. 06-155517
[PTL 9] Japanese Patent Application Laid-Open No. 07-14950
[PTL 10] Japanese Patent Application Laid-Open No. 2001-160607

SUMMARY OF INVENTION

Technical Problem

When intending to laminate additional layers such as printable layer or other functional layer onto shape-retaining films, it is necessary to enhance adhesion between the layers. Moreover, for simplified manufacturing or other reason, it has been required in the art to make direct printing possible on the shape-retaining films, rather than having to laminate an additional printable layer. It would be conceivable to provide microscopic irregularities on the surface of the shape-retaining films in order to make direct printing possible with ink or to ensure good adhesion to other functional layers.

One exemplary method of making microscopic irregularities on the surface of the shape-retaining resin film is to press a mold, heated to a temperature equal to above the melting point of the resin, against the film surface. However, since this method requires temperatures as high as the melting point of resin, it suffers from a disadvantage that the film tends to exhibit reduced shape retainability due to loss of the orientation of molecular chains of polyethylene in the film.

The conventional packaging bags incorporated with aluminum foil exhibit insufficient shape retainability. Thus, even when the bag's open end is folded over on itself twice or more, due to strong recovery force, the open end cannot be kept folded and therefore closing fails.

The packaging bag disclosed by Patent Literature 3 is made easily closable by thickening the aluminum foil relative to the overall film thickness, but this is still insufficient. Moreover, although the packaging bag disclosed by Patent Literature 4 is made relatively easily closable as it has plastically deformable thin bars incorporated into the sides of the bag that fold in, it suffers from a drawback of increased processing costs. In some applications, shape-retaining packaging bags that are free from any metal foil such as aluminum foil may be desired.

Shape-retaining fibers are required not only to have higher shape retainability, but also appropriate levels of elasticity, thermal conductivity and other properties according to the intended applications. For example, shape-retaining fibers used in fabrics are required to be elastic enough for them to be woven into a fabric, and when the fabric is intended for clothes, high thermal conductivity may be required as well.

Fibers known in the art that exhibit high thermal conductivity include carbon fibers and ultra high molecular weight polyethylene fibers. However, not only they have expensive but they are extremely high elastic modulus, making it difficult for them to be woven into a fabric.

For their low intrinsic viscosity [η], it would be conceivable to process inexpensive general-purpose polyethylenes into fibers having low elastic modulus; however, they exhibit poor melt spinnability. Thus, although there have been cases where general-purpose polyethylenes are employed as the core or sheath materials of core-sheath fibers, it has been difficult in the art to form fibers only with polyethylene.

Core-sheath fibers in which polyethylene is used as the sheath material exhibit a certain, yet insufficient, level of thermal conductivity. It is also difficult to confer shape retainability to core-sheath fibers in which polyethylene is used as the core or sheath material.

Heat-conductive sheets need to be accommodated in bent or folded state inside electronic devices that have inadequate space around heat sources. Deformation of the heat-conductive sheet during heat dissipation poses a risk that the heat conducting through the heat-conductive sheet damages nearby electric circuits. For this reason, also during heat dissipation, the heat-conductive sheet needs to retain its shape in the available space.

However, the conventional heat-conductive sheets (silicone rubber sheets) disclosed by Patent Literatures 6 to 10 exhibit low shape retainability and are relatively rigid. Thus, not only they are hard to be accommodated in bent or folded state into electronic devices, but they impose a risk of damaging other circuits in the electronic device due to deformation during heat dissipation.

In electronic devices in which high-precision circuits are densely constructed, there is a concern that heat conducted from heat sources to heat-vulnerable parts of the circuits negatively affects circuit performance. It is difficult for heat-conductive films that exhibit isotropic thermal conductivity to circumvent such heat-vulnerable parts, resulting in a risk of thermally damaging the circuits.

The present invention has been accomplished in view of the foregoing circumstances in the art, and aims to achieve the objectives described below. That is, a first aspect of the present invention is to provide a shape-retaining film that exhibits high shape retainability as well as superior adhesion to ink and the like, and a process for producing the same.

A second aspect of the present invention is to provide a packaging laminate film that exhibits high shape retainability and a packaging material including the same, using a relatively simple production process.

A third aspect of the present invention is to provide a shape-retaining fiber that exhibits high shape retainability, elasticity enough for it to be woven into a fabric, and high thermal conductivity, even though the fiber is composed of general-purpose polyethylene composition.

A fourth aspect of the present invention is to provide an anisotropic heat-conductive film that exhibits good thermal conductivity as well as flexibility and shape retainability, a heat dissipation device including the same, and an electronic device including the same.

Solution to Problem

The inventors have established that mere stretching of a polyethylene film at a typical stretch ratio fails to form microscopic irregularities on the film surface, but stretching of a particular polyethylene film at a certain high stretch ratio or above under a particular production condition (e.g., under radiation heating) results in the formation of microscopic irregularities on the film surface. The inventors have also established that films having such microscopic irregularities on the surface exhibit superior adhesion to ink and the like. A first aspect of the present invention relates to shape-retaining films and a process for producing the same given below.

[1] A shape-retaining film including an ethylene homopolymer or a ethylene/$C_{3-6}$ α-olefin copolymer having α-olefin unit content of less than 2 wt %, the ethylene homopolymer and ethylene/$C_{3-6}$ α-olefin copolymer each having a density of 950 kg/$m^3$ or more and a ratio of weight-average molecular weight (Mw) to number-average molecular weight (Mn) of 5 to 20, wherein the shape-retaining film has a tensile elasticity modulus of 6 to 50 GPa, and exhibits an angle of recovery from 90° bending of 8° or less or an angle of recovery from 180° bending of 65° or less.

[2] The shape-retaining film according to [1] above, wherein the tensile elasticity modulus is 16 to 50 GPa, and the shape-retaining film has surface roughness Ra of 0.17 to 0.23 μm and surface projection interval Sm of 50 to 180 μm.

[3] The shape-retaining film according to [1] or [2] above, wherein the tensile elasticity modulus is 20 to 50 GPa.

[4] The shape-retaining film according to any one of [1] to [3] above, wherein the shape-retaining film has a thickness of 20 to 100 μm.

[5] A process for producing the shape-retaining film according to any of [1] to [4] above, including:

obtaining an original film containing an ethylene homopolymer or a ethylene/$C_{3-6}$ α-olefin copolymer having α-olefin unit content of less than 2 wt %, the ethylene homopolymer and ethylene/$C_{3-6}$ α-olefin copolymer each having a density of 950 kg/$m^3$ or more and a ratio of weight-average molecular weight (Mw) to number-average molecular weight (Mn) of 5 to 20; and stretching the original film at a stretch ratio of 10 to 30.

Shape-retaining films obtained by stretching polyethylene films at a certain high stretch ratio or above exhibit high shape retainability. Laminate films including such shape-retaining films are suitable as packaging laminate films used in packaging materials or other materials. A second aspect of the present invention relates to packaging laminate films and a process for producing the same given below.

[6] A packaging laminate film including the shape-retaining film according to any one of [1] to [4] above.

[7] The packaging laminate film according to [6] above, where an angle of recovery from 180° bending for the packaging laminate film is 110° or less.

[8] The packaging laminate film according to [6] or [7] above, further including at least one layer selected from the group consisting of aluminum layer, protection layer, and heat seal layer.

[9] A packaging material constituted by the packaging laminate film according to any one of [6] to [8] above, wherein some edges of the packaging laminate film are sealed, and an opening plane of the packaging material intersects stretch direction of the shape-retaining film included in the packaging laminate film.

[10] The packaging material according to [9] above, wherein the opening plane of the packaging material substantially perpendicularly intersects the stretch direction of the shape-retaining film included in the packaging laminate film.

[11] A process for producing a packaging material including:
obtaining the packaging laminate film according to any one of [6] to [8] above;
overlaying the packaging laminate film on itself or on another sheet to produce a laminate; and
sealing some edges of the laminate film produced.

It would be conceivable to employ melt spinning as a means of processing general-purpose polyethylenes into fibers. However, general-purpose polyethylenes such as high-density polyethylene (HD-PE) exhibit poor melt spinnability and therefore are hard to become fibrous. Accordingly, in the present invention, stretched general-purpose polyethylene films are defibrated (cut) into fibers that exhibit both shape retainability and thermal conductivity. A third aspect of the present invention relates to a shape-retaining fiber and the like given below.

[12] A shape-retaining fiber including a polyethylene having an intrinsic viscosity [r] of less than 3.5 dl/g, wherein the shape-retaining fiber has a tensile elasticity modulus of 16 to 50 GPa, and exhibits an angle of recovery from 90° bending of 8° or less.

[13] A three-dimensional fabric in film form including fibers woven in two dimensions as well as in thickness direction, wherein the fibers woven in the thickness direction include the shape-retaining fiber according to [12] above.

The inventors have also established that stretched films composed mainly of polyethylene and stretched at a certain high stretch ratio or above exhibit not only high shape retainability in stretch direction (X direction), but also high thermal conductivity in stretch direction and therefore exhibit anisotropic thermal conductivity. A fourth aspect of the present invention relates to anisotropic heat-conductive films given below.

[14] An anisotropic heat-conductive film including an ethylene homopolymer or a ethylene/$C_{3-6}$ α-olefin copolymer having a-olefin unit content of less than 2 wt %, the ethylene homopolymer and ethylene/$C_{3-6}$ α-olefin copolymer each having a density of 950 kg/m$^3$ or more and a ratio of weight-average molecular weight (Mw) to number-average molecular weight (Mn) of 5 to 20, wherein
a tensile elasticity modulus in X direction is 6 to 50 GPa, and a tensile elasticity modulus in Y direction is less than 6 GPa, the Y direction running substantially perpendicularly to the X direction.

[15] The anisotropic heat-conductive film according to [14] above, wherein the tensile elasticity modulus in X direction is 12 to 40 GPa.

[16] The anisotropic heat-conductive film according to [14] or [15] above, wherein L1/W1 ratio is 60 or less, where L1 is a dimension in the X direction and W1 is a dimension in the Y direction.

[17] The anisotropic heat-conductive film according to [16] above, wherein the L1/W1 ratio exceeds 1.0.

[18] A heat dissipation device including:
the anisotropic heat-conductive film according to any one of [14] to [17] above; and
a heat dissipator disposed at least at one end in the X direction of the anisotropic heat-conductive film.

[19] An electronic device including the anisotropic heat-conductive film according to any one of [14] to [17] above.

[20] The electronic device according to [19 above, further including:
a heat source; and
a heat dissipator disposed apart from the heat source,
wherein the anisotropic heat-conductive film conducts heat from the heat source to the heat dissipator, and
a L2/W2 ratio is 30 or less, where L2 is a distance between the heat dissipator and a center of a projection of the heat source on the anisotropic heat-conductive film or a center of a contact area between the anisotropic heat-conductive film and the heat source in the X direction of the anisotropic heat-conductive film, and W2 is a distance across the anisotropic heat-conductive film in the Y direction at the center of the projection or the center of the contact area.

Advantageous Effects of Invention

The present invention can provide shape-retaining films that exhibit high shape retainability as well as superior adhesion to ink and other functional layers.

The present invention can also provide packaging laminate films that exhibit high shape retainability and packaging materials including the same, using a relatively simple production process.

The shape-retaining fiber according to the present invention is composed of general-purpose polyethylene composition and exhibits high shape retainability as well as a moderate level of elasticity; therefore, it can be easily woven into a fabric that exhibits shape retainability. The shape-retaining fiber according to the present invention can also be processed into a twisted yarn or micro-multifilament.

The shape-retaining fiber according to the present invention is composed mainly of polyethylene that exhibits high thermal conductivity and therefore exhibits high thermal conductivity compared to other conventional fibers such as core-sheath fibers. Thus, fabrics in which the shape-retaining fiber according to the present invention is woven are used as clothing fabrics that offer high heat dissipation.

The present invention can also provide anisotropic heat-conductive films that exhibit good thermal conductivity as well as flexibility and good shape retainability.

BRIEF DESCRIPTION OF DRAWINGS

FIGS. 10A to 10E illustrate structures of packaging laminate films in Examples;

FIGS. 11A to 11E illustrate structures of packaging laminate films in Examples;

FIGS. 12A to 12C illustrate structures of packaging laminate films in Comparative Examples;

DESCRIPTION OF EMBODIMENTS 1.1 Shape-Retaining Film

Figure 1A:
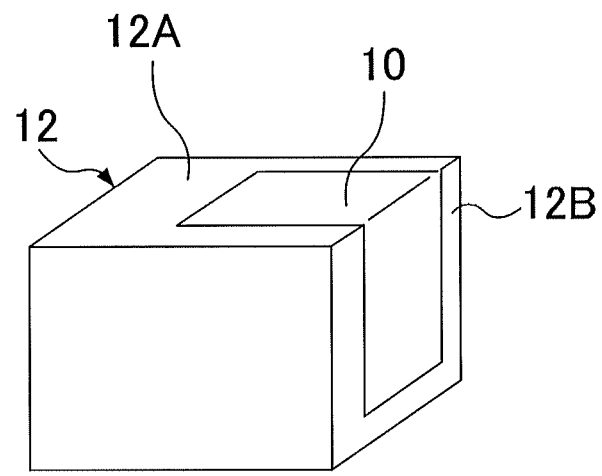
FIGS. 1A and 1B illustrate a method of measuring an angle of recovery from 90° bending.

A shape-retaining film according to the present invention is obtained by stretching a film containing polyethylene.

The polyethylene contained in the shape-retaining film according to the present invention may be either ethylene homopolymer or ethylene/α-olefin copolymer. Copolymerization of ethylene with small amounts of α-olefins leads to increased moldability.

The α-olefins used for the ethylene/α-olefin copolymer may be $C_{3-6}$ α-olefins. Examples of the $C_{3-6}$ α-olefins include propylene, 1-butene, 1-hexene and 1-heptene, with propylene being preferable. The amount of building blocks derived from the α-olefins in the ethylene/α-olefin copolymer is preferably 2 wt % or less, and more preferably 0.05 to 1.5 wt %.

The density of the polyethylene contained in the shape-retaining film according to the present invention is preferably 950 kg/m$^3$ or more, more preferably 955 to 970 kg/m$^3$, and still more preferably 960 to 970 kg/m$^3$. General-purpose high-density polyethylene (HDPE) may be employed. A density of less than 950 kg/m$^3$ makes it difficult to provide shape retainability by stretching. On the other hand, when the density is too high, the resin becomes more difficult to be molded into a film by melt casting.

The molecular weight distribution (weight-average molecular weight (Mw)/number-average molecular weight (Mn)) of the polyethylene contained in the shape-retaining film according to the present invention is preferably 5 to 20, and more preferably 6 to 16. When the molecular weight distribution is too narrow, stretching at high stretch ratio becomes difficult due to reduced stretchability. On the other hand, when the molecular weight distribution is too broad, abundant low-molecular weight components may reduce the mechanical strength of the resultant film or may contaminate the stretcher to reduce productivity. The molecular weight distribution of the polyethylene can be measured by gel permeation chromatography (GPC).

The melt flow rate of the polyethylene contained in the shape-retaining film according to the present invention, as measured in accordance with JIS K-6922-2 at 190° C. under a load of 2.16 kg, is preferably 0.1 to 1.0 g/10 min, and more preferably 0.2 to 0.5 g/10 min. When the melt flow rate falls within any of the above ranges, the resin exhibits moderate flow ability during melt casting carried out in the production process (later described), facilitating formation of a film having uniform thickness.

Polyethylenes that have a relatively high density and an appropriate molecular weight distribution are easily processed into films, which tend to have superior shape retainability when stretched at a high stretch ratio.

The intrinsic viscosity [η] of the polyethylene contained in the shape-retaining film according to the present invention is preferably less than 3.5 dl/g. The intrinsic viscosity of the polyethylene can be measured using decalin solvent at 135° C.

The shape-retaining film according to the present invention may further contain low-density polyethylene (LDPE) or linear low-density polyethylene (LLDPE) having side chains having 9 or fewer carbon atoms, in amounts that do not compromise the effects of the present invention. Addition of trace amounts of the low-density polyethylene (LDPE) or linear low-density polyethylene (LLDPE) can prevent the shape-retaining film from tearing in the direction parallel to stretch direction (i.e., lengthwise tearing).

The density of the low-density polyethylene (LDPE) is preferably 910 to 930 kg/m$^3$. The melt flow rate of the low-density polyethylene (LDPE), as measured in accordance with JIS K-6922-2 at 190° C. under a load of 2.16 kg, is preferably 0.05 g/min to 10.0 g/min, and more preferably 0.05 to 5.0 g/min. The density of the linear low-density polyethylene (LLDPE) is preferably 910 to 950 kg/m$^3$.

The total amount of the low-density polyethylene (LDPE) and linear low-density polyethylene (LLDPE) is preferably less than 10 weight parts per 100 weight parts of the high-density polyethylene (HDPE), and more preferably less than 5 weight parts. When the low-density polyethylene (LDPE) and linear low-density polyethylene (LLDPE) are present in an amount exceeding the above range, the resultant film exhibits reduced shape retainability, which is not preferable.

The shape-retaining film according to the present invention may further contain other thermoplastic resins, additives, inorganic fillers, coloring pigments and other agents in amounts that do not compromise the effects of the present invention.

Examples of the additives include antioxidants, neutralizers, lubricants, antistatic agents, anti-blocking agents, water resisting agents, water repellents, antibacterial agents, and processing aids (e.g., waxes). The processing aids are, for example, waxes such as low-molecular weight polyolefins and alicyclic polyolefins. The organic fillers are, for example, glass fibers, glass beads, talc, silica, mica, calcium carbonate, magnesium hydroxide, alumina, zinc oxide, magnesium oxide, magnesium hydroxide, aluminum hydroxide, titanium oxide, calcium oxide, calcium silicate, molybdenum sulfide, antimony oxide, clay, diatom earth, calcium sulfate, asbestos, iron oxide, barium sulfate, magnesium carbonate, dolomite, montmorillonite, bentonite, iron powder, aluminum powder, and carbon black.

The processing aid or antistatic agent may be present in an amount of, for example, 5 wt % or less, and preferably 1 wt % or less. The inorganic filler or coloring pigment may be present in an amount of, for example, 10 wt % or less, and preferably 5 wt % or less.

The tensile elasticity modulus of the shape-retaining film according to the present invention is preferably 6 to 50 GPa, more preferably 13 to 50 GPa, still more preferably 16 to 50 GPa, and most preferably 20 to 50 GPa. When the tensile elasticity modulus is less than 6 GPa, it becomes difficult to provide sufficient shape retainability, and when the tensile elasticity modulus exceeds 50 GPa, the film may become breakable. The tensile elasticity modulus of the shape-retaining film can be adjusted by the composition, stretch ratio, heating condition, etc., of the film. For example, the tensile elasticity modulus of the shape-retaining film can be increased by increasing the stretch ratio.

The tensile elasticity modulus of the shape-retaining film according to the present invention can be measured in accordance with JIS K7161, More specifically, a test specimen is prepared by cutting the film into a strip which is 10 mm in width (dimension in the direction perpendicular to the stretch direction of polyethylene film) and 120 mm in length (dimension in the stretch direction of polyethylene film), and then this test specimen is measured for tensile elasticity modulus using a tensile tester under the following condition: temperature=23° C., chuck-to-chuck distance=100 mm, and tensile rate=100 mm/min.

The term "stretch direction" as used herein refers to a direction in which molecular chains of polyethylene are fully stretched, or a direction in which tensile elasticity modulus ranges from 6 to 50 GPa ("X direction" later described). The term "direction perpendicular to the stretch direction" as used herein refers to a direction that runs perpendicularly to the direction in which molecular chains of polyethylene are fully stretched, or a direction in which tensile elasticity modulus is less than 6 GPa ("Y direction" later described).

The shape-retaining film according to the present invention exhibits high tensile elasticity modulus and therefore good shape retainability. For enhanced shape retainability, the shape-retaining film according to the present invention preferably exhibits an angle of recovery from 90° bending of 8° or less, and more preferably 5° or less.

The angle of recovery from 90° bending for the shape-retaining film according to the present invention can be measured as follows: A test specimen is first prepared by cutting the film into a strip which is 10 mm in width (dimension in the direction perpendicular to stretch direction of polyethylene film) and 50 mm in length (dimension in stretch direction). The test specimen is bent at 90° along a right-angled corner (constituted by two each intersecting surfaces) of a steel article, the bending axis being parallel to the width direction of the test specimen. And then, the test specimen is kept bent for about 5 seconds (see FIG. 1A). With the test specimen secured to the top surface of the steel article, the bending force is then released so that the test specimen is allowed to be separated from the lateral surface of the steel article, and the angle between the test specimen and the lateral surface is measured (see FIG. 1B). The angle of recovery from 90° bending can be measured at 23° C. and 55% humidity.

In order, for instance, to confer sufficient shape retainability at the time when the shape-retaining film used in a laminate film (later described), the angle of recovery from 180° bending is preferably 65° or less, more preferably 30° or less, and still more preferably 25° or less. The angle of recovery from 180° bending for the shape-retaining film can be measured in the same manner as that for a packaging laminate film (later described).

The shape-retaining film according to the present invention may have irregularities on the surface in the direction perpendicular to the stretch direction. Such microscopic irregularities are considered to be formed during the process in which the polymer chains of polyethylene are oriented by being stretched at a certain stretch ratio or above. These irregularities may enhance adhesion to other layers or ink.

For enhanced adhesion to other layers or ink, surface roughness Ra of the shape-retaining film in the direction perpendicular to the stretch direction is preferably 0.17 to 0.23 μm, and more preferably 0.18 to 0.20 Surface projection interval Sm of the shape-retaining film in the direction perpendicular to the stretch direction is preferably 50 to 180 μm, and more preferably 100 μm to 160 μm. When surface roughness Ra is too small, anchoring effects are hard to be produced resulting in insufficient adhesion to other layers (e.g., adhesive layer) or ink. When surface projection interval Sm is too small, ink or the material of other layers (e.g., adhesive layer) is hard to explore the gaps between irregularities, making the surface less wettable with ink. When surface projection interval Sm is too large, anchoring effects are hard to be produced resulting in less adhesion to other layers (e.g., adhesive layer) or ink.

Surface roughness Ra and surface projection interval Sm of the shape-retaining film according to the present invention are adjusted by the stretch ratio. For example, surface roughness Ra increases and surface projection interval Sm decreases with increasing stretch ratio of the shape-retaining film. The profile of irregularities on the surface of the shape-retaining film may be adjusted not only by the stretch ratio, but also by the stretching method or heating method employed during stretching. For example, the stretching method preferably excludes stretching by press rolling. The reason for this is that stretching of an original film containing polyethylene by press rolling entails crushing of irregularities on the film surface and therefore the film surface becomes smooth. The heating method employed during stretching is preferably one that can heat the original film containing polyethylene as evenly as possible (e.g., radiation heating). This is because stretching an original film containing polyethylene while evenly heating it by radiation heating or other heating method makes it possible to prevent partial film tearing upon stretching or excessive formation of irregularities on the film surface, in particular where stretching is carried out at a high stretch ratio.

Surface roughness Ra and surface projection interval Sm of the shape-retaining film according to the present invention can be measured by the contact stylus method using a surface roughness/profile measuring instrument (SURFCOM 570A, Tokyo Seimitsu Co., Ltd.). More specifically, a diamond tipped conical stylus may be used, which has tip curvature radius R of 5 μm and angle θ of 90°. Measurement conditions may be as set follows: cutoff=0.8 mm, tracing speed=0.3 mm/second, and measurement length=2.5 mm.

The thickness of the shape-retaining film according to the present invention is preferably 20 to 100 μm, and more preferably 30 to 40 μm.

Since microscopic irregularities may be formed on the surface of the shape-retaining film according to the present invention, the surface with the microscopic irregularities can serve as a printing surface. Shape-retaining films made of polyethylene are free from polar groups on the surface layer, and therefore, they sometimes exhibit insufficient ink printability or insufficient adhesion to other resins. For increased ink printability or adhesion to other resins, the shape-retaining films may be subjected to corona discharge treatment on their surface.

Corona discharge treatment may be carried out such that, although depending on the type of ink, the ink can easily explore the gaps between irregularities by their capillary action, e.g., such that the film surface has a surface tension of 40 dyn/cm or more. The intensity of corona discharge treatment can be adjusted by the current density, treatment time, atmosphere gas type, etc. Atmosphere gas used for corona discharge treatment may be air, nitrogen gas, oxygen gas or other gas.

1.2 Process for Producing Shape-Retaining Film

The shape-retaining film according to the present invention can be obtained by the process including the steps of: obtaining the above-described original film containing polyethylene; and stretching (preferably uniaxially stretching) the original film at a certain stretch ratio or above. The polyethylene contained in the original film is substantially the same as the above polyethylene contained in the shape-retaining film. Note that as the density of polyethylene may increase when crystallized by stretching, the density of the polyethylene contained in the original film is preferably 940 kg/m$^3$ or more.

The original film may be prepared by melt casting of a polyethylene-containing resin composition or may be a commercially available film. The original film prepared by melt casting can be obtained by melt-kneading of the polyethylene-containing resin composition described above in an extruder, and excluding the molten resin from a T-die onto a cooling roll for solidification. The temperature of the cooling roll is set to a level sufficient to solidify the molten resin to some extent; it is set to, for example, on the order of 80° C. to 100° C.

The thickness of the original film is, for example, on the order of 100 to 1,000 µm, preferably 100 to 500 µm, and more preferably 200 to 500 µm.

The original film containing polyethylene is stretched (preferably uniaxially stretched) at a certain stretch ratio. Uniaxial stretching is preferably carried out by feeding the original film in a roll stretcher, pre-heating it with a pre-heating roll, and uniaxially stretching it in MD direction. For increased production efficiency, the original film is preferably stretched in MD direction immediately after it is pre-heated. The term "uniaxial stretching" as used herein means stretching in a single axis direction. However, the film may also be stretched in different directions than the intended single axis direction so long as the effects of the present invention are not compromised. Some stretching machines cause stretching in a single axis direction as well as in substantially different directions than the single axis direction, even when stretching only in the single axis direction is intended.

To ensure shape retainability, the stretch ratio is generally 10 or above, preferably 11 or above, more preferably 15 or above, still more preferably 20 or above, and yet still more preferably 20 to 30. A stretch ratio of less than 10 results in failure to provide sufficient shape retainability due to insufficiently increased tensile elasticity modulus. In order to form the above-described irregularities on the film surface, the stretch ratio is preferably 20 to 30.

In order for the stretch ratio to fall within any of the above ranges, it is important to appropriately adjust the heating temperature during pre-heating and during stretching, particularly to evenly heat the film in thickness direction. Note that stretching herein excludes stretching by press rolling.

The pre-heating temperature of the pre-heating roll is set to a level sufficient to soften the original sheet so as to be suitable for stretching; it can be set to, for example, 120° C. to 140° C.

Stretching can be carried out by making a difference in circumferential speed between the pre-heating roll immediately before starting stretching and the stretching roll, while heating the original film at 120° C. to 140° C. There are no particular limitations on the stretching rate; it can be set to 100 to 1,000%/sec. In order to prevent slippage of the film during stretching it is preferable to press pinch rolls against the pre-heating roll and stretching roll, respectively.

Heating of the film during stretching may be effected either by roll heating or radiation heating, with radiation heating being preferable in view of its easiness with which to evenly heat the film in thickness direction. Radiation heating can be carried out by directing radiation onto the original film surface from a light source. Preferable light sources are those capable of heating the original film as evenly as possible in thickness direction; examples thereof include halogen lamps that emit radiation containing many near infrared light components, lasers, and far-infrared heaters. In order to ensure stable stretching during film stretching at a high stretch ratio, heating is preferably carried out by directing radiation in slit form that runs along TD direction (width) of the original film, by focusing radiation to a size of 1 cm or less in MD direction (length) of the original film using a curved reflector or the like.

It is preferable in the present invention not to perform a press rolling step between the step of obtaining an original film and the step of uniaxially stretching the original film. The reason for this is that a film obtained by press rolling an original film followed by uniaxial stretching fails to have a desired irregularity profile on the surface.

The stretched film may be subjected to annealing treatment where necessary. Annealing treatment can be carried out by bringing the stretched sheet in contact with a heating roll.

The shape-retaining film according to the present invention may exhibit superior shape retainability as well as have microscopic irregularities formed on the surface, whereby it is well bonded to other layers (e.g., heat seal layer). Furthermore, when printing the surface of the shape-retaining film, direct printing is made possible without having to provide an additional printable layer thereon, which has been conventionally been required in the art.

Since the shape-retaining film according to the present invention exhibits high shape retainability as described above, it is suitably used in packaging laminate films and packaging materials such as those described below.

2.1 Packaging Laminate Film

A packaging laminate film according to the present invention includes a film of the shape-retaining film described above, and may further contain other additional layer(s) where necessary.

It is only necessary for such additional layers included in the packaging laminate film according to the present invention to be layers that may confer properties or functions to the packaging laminate film; the materials thereof may be resins, metals, paper, woven cloths, non-woven cloths, and foams. Preferable examples of the additional layers to be included in the packaging laminate film according to the present invention include gas barrier layer, protection layer, and heat seal layer. These additional layers may be used alone or in combination.

The gas barrier layer may be a metal or resin layer, but is preferably an aluminum foil layer for its lightness, good gas barrier property, etc. The thickness of the aluminum foil layer is set to a level sufficient to provide gas barrier property; it may be set to, for example, on the order of 5 to 20 μm.

It should be noted that there are cases where the packaging laminate film is preferably free from any metal layer such as aluminum foil layer, depending on the intended application of the packaging laminate film.

In such cases the gas barrier included in the packaging laminate film is preferably a resin layer rather than a metal layer such as an aluminum foil layer.

There are no particular limitations on the resins used for the protection layer; preferable examples include polyesters, polyethylenes, polypropylenes and nylons, for their ability of enhancing printability or strength. Preferred among polyesters is polyethylene terephthalate (PET), preferred among polypropylenes is biaxially oriented polypropylene (OPP), and preferred among nylons is oriented nylon (ONy).

As the protection layer, an oriented PET film is suitably used. However, due to its high impact resilience (spring back property), the oriented PET film tends to reduce shape retainability. On the other hand, a biaxiallyoriented polypropylene (OPP) film has high rigidity but has small impact resilience and, therefore, may increase the rigidity or tear resistance of a packaging laminate film without compromising shape retainability. For these reasons, it is possible to provide a packaging laminate film that exhibits superior rigidity and mechanical strength as well as sustained shape retainability by incorporating the oriented polypropylene film and thinning the oriented PET film as much as possible.

The protection layer may be designed in either a single-layer or multilayer configuration. The thickness of the protection layer (single layer) may on the order of 5 to 20 μm when polyester is used, and on the order of 10 μm to 30 μm when polypropylene is used.

The resins used for the heat seal layer are preferably resins that have melting points ranging from 90° C. to 170° C. Preferable examples of such resins include linear low density polyethylene (LLDPE), low density polyethylene (LDPE), cast polypropylene (CPP), ionomers, and polystyrenes. Particularly preferred are linear low density polyethylene (LLDPE) from the viewpoint of ensuring low-temperature sealing property, seal strength, glossiness and cold resistance, and cast polypropylene (CPP) from the viewpoint of ensuring seal strength, transparency, wear resistance, dampproofness, and moderate level of stiffness. These resins may be used alone or in combination. The thickness of the heat seal layer is preferably 10 to 70 μm, and more preferably 10 to 50 μm.

Although depending on its intended application, the packaging laminate film according to the present invention preferably includes the shape-retaining film and the protection layer, and preferably further includes the gas barrier layer. The shape-retaining film may constitute either the outermost layer or intermediate layer of the packaging laminate film, preferably constitutes the outermost layer. The reason for this is that the shape-retaining film exhibits high shape retainability as well as heat sealing property and printability, a property conferred by surface irregularities. For example, when the shape-retaining film is employed as the interior surface layer of a packaging material, the packaging material can be heat-sealed, direct printing can be performed on the interior surface of the packaging material, and so forth. On the other hand, when the shape-retaining film is employed as the exterior surface layer of a packaging material, printing can be easily performed on the exterior surface of the packaging material.

Figure 2:
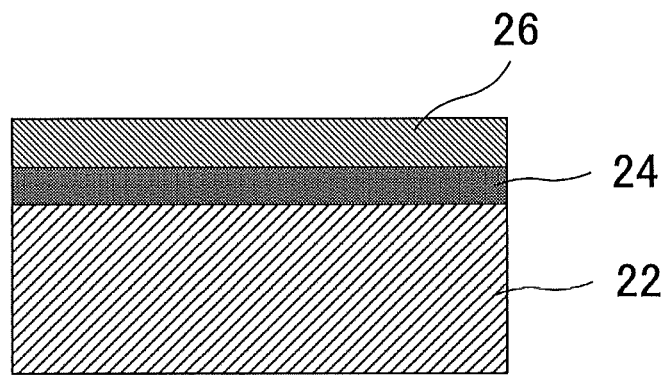
FIG. 2 illustrates one example of a packaging laminate film.

FIG. 2 illustrates one example of a laminate structure of a packaging laminate film according to the present invention. As illustrated in FIG. 2, packaging laminate film 20 includes shape-retaining film 22, aluminum foil layer 24, and protection layer 26. With this configuration, shape-retaining film 22 of packaging laminate film 20 functions not only functions as a shape-retaining layer, but may serve as a heat seal layer, and protection layer 26 may serve as a printable layer.

The overall thickness of the packaging laminate film according to the present invention is preferably 50 to 200 μm, and more preferably 70 to 150 μm. When the overall thickness is less than 50 μm, the packaging laminate film exhibits insufficient mechanical strength, and when the overall thickness exceeds 200 μm, the recovery force becomes high enough to reduce shape retainability.

The packaging laminate film according to the present invention includes the shape-retaining film described above, and therefore exhibits high shape retainability. Although depending on its layer configuration or overall thickness, the angle of recovery from 180° bending for the packaging laminate film is preferably 110° or less, more preferably 80° or less, still more preferably 65° or less, and most preferably 50° or less.

Exemplary measures for ensuring that the packaging laminate film according to the present invention exhibits an angle of recovery from 180° bending that falls within any of these ranges include: 1) incorporating therein a shape-retaining film that exhibits a small angle of recovery from 180° bending; 2) incorporating therein an additional layer such as aluminum foil that has a certain level of shape retainability; and 3) increasing the thickness of the shape-retaining film relative to the overall thickness of the packaging laminate film.

The angle of recovery from 180° bending for the packaging laminate film according to the present invention can be measured in the manner described below. Specifically, 1) a test specimen is prepared which is 10 mm in width (dimension in the direction perpendicular to the stretch direction) and 50 mm in length (dimension in stretch direction); 2) the test specimen is bent at 180° along the bottom, edge and top surfaces of a plate, the bending axis being parallel to width direction of the test specimen. And then, the test specimen is kept bent for about 30 seconds (see FIG. 15A); and 3) 30 seconds after releasing the bending force on the packaging laminate film, angle θ between the test specimen and the top surface of the plate is measured (see FIG. 15B). Angle θ can be found as the average of two measurements on both sides of the test specimen—the first is the angle measured with one side of the test specimen brought in contact with the plate, and the second is the angle measured with the other side brought in contact with the plate. The angle of recovery from 180° bending can be measured at 23° C. and 55% humidity.

The packaging laminate film according to the present invention exhibits high shape retainability. It is thus suitably used as a self-standing packaging material from which the contents can be taken out while keeping it in a vertical position and which can be closed by simply folding over the open end on itself.

2.2 Process for Producing Packaging Laminate Film

A process of the present invention for producing a packaging laminate film includes the steps of: 1) obtaining the shape-retaining film described above; and 2) obtaining a packaging laminate film by laminating one or more other additional layers onto the surface of the shape-retaining film.

As described above, the shape-retaining film can be obtained by uniaxially stretching an original film containing polyethylene at a certain stretch ratio.

A packaging laminate film is obtained by laminating one or more other additional layers onto the surface of the shape-retaining film. Lamination of the additional layer(s) onto the shape-retaining film can be carried out through any of the processes known in the art; for increased adhesion between the layers, adhesives may be used. Lamination processes using adhesives include extrusion lamination in which the molten web of resin is extruded in film shape onto the shape-retaining film, and dry lamination in which an adhesive diluted with solvent is applied onto the substrate and the solvent is evaporated for bonding. Preferred is the dry lamination process in view of its general easiness with which to form thin adhesive layers.

Examples of adhesives used for extrusion lamination include soft resins such as low density polyethylene (LDPE), linear low density polyethylene (LLDPE), ethylene/vinyl acetate copolymer resins, and ethylene/acrylic acid copolymer resins. Examples of adhesives used for dry lamination include dry lamination adhesives known in the art, such as acrylic-, epoxy- or urethane (e.g., urethane resin)-based adhesives. The thickness of the adhesive layer may be on the order of 1 to 10 μm, preferably on the order of 2 to 8 μm.

In particular, when a packaging laminate film is to be fabricated by extrusion lamination, it is important to adjust the temperature of the molten resin in order for the packaging laminate film to exhibit sustained shape retainability.

When the heating temperature for the shape-retaining film exceeds 120° C., it results not only in larger angle of recovery from bending but also in rapid rise in thermal shrinkage. Thus, when intending to obtain a packaging laminate film by extrusion lamination, it is required to adjust the temperature of the adhesive to be extruded, lamination speed, lamination procedure, etc., such that the substantial temperature of the shape-retaining film does not exceed 120° C. An exemplary method of adjusting the lamination procedure involves extrusion of adhesive on other layer to form an adhesive layer, followed by lamination of the adhesive layer onto of the shape-retaining film. In order to prevent post-lamination shrinkage of the shape-retaining film, the packaging laminate film is preferably cooled immediately after lamination.

As described above, the shape-retaining film according to the present invention has microscopic irregularities on the surface. The shape-retaining film thus can be well bonded to other layers due to anchoring effects even under such conditions where good bonding is somewhat difficult.

2.3 Packaging Material

Since the packaging laminate film according to the present invention exhibits high shape retainability, it is suitable as a packaging material for foods, detergents, etc., as well as a packaging material for refills. Moreover, elimination of any metal foil such as aluminum foil from the packaging laminate film renders it suitable also as a packaging material for microwave oven cooking.

The packaging material herein is in the form of lid (lid material), bag or tube, which includes the packaging laminate film described above. Examples of the lid include lid materials for air-tight sealing of containers for foods such as cup noodles and puddings. Examples of the bag include gusset bags and standing pouches (self-standing bags).

Figure 3:
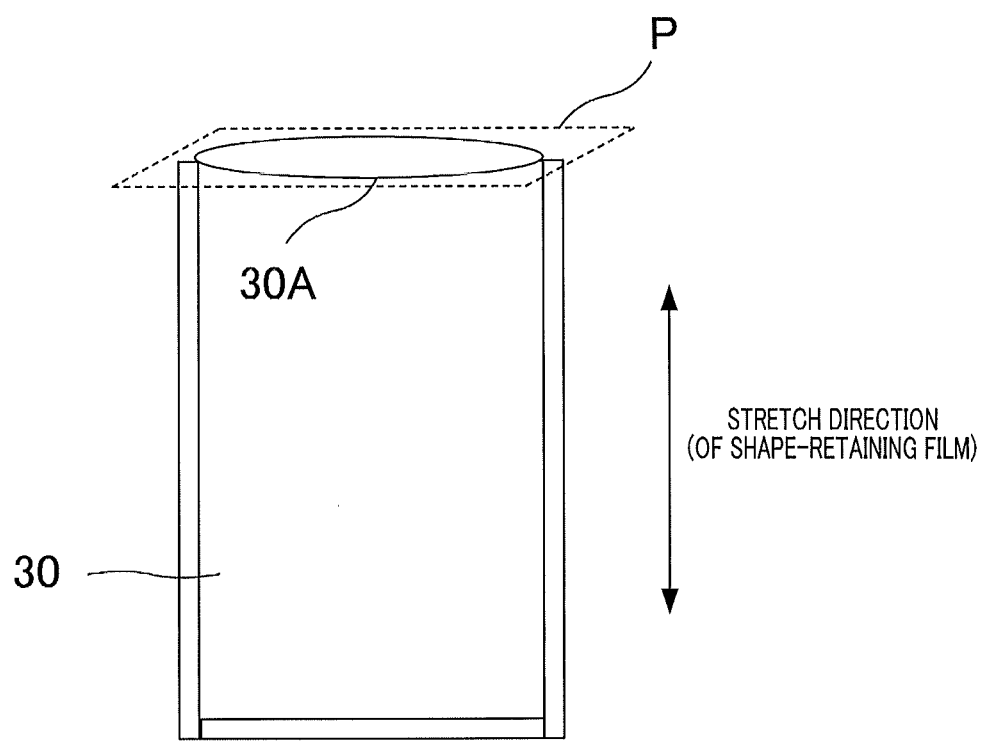
FIG. 3 illustrates one example of a packaging material.

FIG. 3 illustrates one example of a packaging material in the form of bag. As illustrated in FIG. 3, packaging material 30 is so designed that opening plane P intersects the stretch direction of the shape-retaining film of the packaging material, preferably substantially perpendicularly to the stretch direction. Opening plane P of packaging material 30 refers to a plane including opening 30A. The term "substantially perpendicularly" encompasses not only 90° intersection, but also 90±15° intersections.

That is, the shape-retaining film of packaging material 30 exhibits high shape retainability in the stretch direction. Thus, packaging material 30 is preferably fabricated such that it is to be folded along the stretch direction of the shape-retaining film (direction in which the bending axis runs substantially perpendicularly to the stretch direction). Namely, opening 30A of packaging material 30 is preferably formed such that it substantially perpendicularly intersects the stretch direction of the shape-retaining film. Packaging material 30 can thereby be placed in a self-standing position and closed by simply folding over it on itself at opening 30A.

The term "opening plane" as used herein encompasses not only "opening plane of actually opened part" but also "opening plane created after opening of part to be opened." Examples of bags having part to be opened include bags obtained by heat-sealing the edge of opening P such as that illustrated in FIG. 3. A notch (incision) or guide line (cut line) with which to remove a heat sealed part is generally formed in the vicinity of such "part to be opened." Thus, for example, the guide line is provided so that it runs substantially perpendicularly to the stretch direction of the packaging material.

2.4 Process of Producing Packaging Material

A packaging material in the form of bag or tube can be produced by the process including the steps of: 1) providing a packaging laminate film; 2) overlaying the packaging laminate film on itself or overlaying the packaging laminate film and other sheet on top of each other; and 3) sealing some edges of the resultant laminate. The other sheet may be a thermoplastic resin sheet or other sheet.

The packaging laminate film is the one described above. Overlaying the packaging laminate film on itself encompasses folding a single packaging laminate over itself, and overlaying two individual packaging laminate films on top of each other. In either case where the packaging laminate film is overlaid on itself or on other sheet, the edges of the laminate are not necessarily have to be perfectly aligned. In other words, it is only necessary that the packaging laminate film be overlaid on itself or on other sheet at a portion to be sealed.

A packaging material is obtained by sealing some edges of the resultant laminate. Sealing may be effected either by means of adhesive or heat sealing, with heat sealing being preferable. Heat sealing temperature is set to a level sufficient to effect bonding of the packaging laminate film to itself or to other sheet. It is, for example, on the order of 100° C. to 300° C. Seal strength is adjusted by the heat sealing temperature, the number of heat sealing operations, heat sealing time, etc.

Any of the heat sealing methods known in the art may be employed. Examples include bar sealing, roller sealing, impulse sealing, high-frequency sealing, and ultrasonic sealing.

The packaging material that includes the packaging laminate film according to the present invention exhibits high shape retainability. The packaging material can thereby be placed in a self-standing position or closed by simply folding over the open end on itself.

3.1 Shape-Retaining Fiber

A shape-retaining fiber according to the present invention contains polyethylene. Polyethylene used is the same as that contained in the shape-retaining film described above. That is, it may be either ethylene homopolymer or ethylene/α-olefin copolymer. The density, molecular weight distribution and other properties of the polyethylene are the same as those described above. Among other polyethylenes, polyethylene whose intrinsic viscosity [η] is less than 3.5 dl/g is preferable.

The shape-retaining fiber according to the present invention may further contain thermoplastic resins other than polyethylene and/or additives in amounts that do not compromise the effects of the present invention. The additives may be the same as those described above, which are to be contained in the shape-retaining film.

The thickness of the shape-retaining fiber according to the present invention is preferably 200 denier or less, and more preferably 100 denier or less, or may be made more smaller. The thickness is preferably of the order of several denier when the fibers are to be bundled into a micro-multifilament. Denier is the mass in grams of 9,000 meters of fiber. The fiber thickness greatly affects the texture (e.g., softness) of a fabric woven from the fiber. The fiber length may be appropriately adjusted according to the intended application.

The shape-retaining fiber according to the present invention may have rectangular shape in cross section. This is because the shape-retaining fiber according to the present invention is produced by micro-slitting of the polyethylene film, as will be described later. When the shape-retaining fiber has rectangular shape in cross section, the short side of the cross section is preferably 20 to 100 μm, and more preferably 30 to 40 μm, and the long side is preferably 100 to 500 μm. When the aspect ratio of the cross section is too large, the fiber tends to be twisted when woven into a fabric. When the shape-retaining fiber is processed into a micro multifilament, the long and short sides of its cross section are both made short.

The shape-retaining fiber according to the present invention exhibits superior shape retainability. Shape retainability is indicated by an angle of recovery from 90° bending. The shape-retaining fiber according to the present invention exhibits an angle of recovery from 90° bending of 8° or less, preferably 5° or less. The angle of recovery from 90° bending for the shape-retaining fiber is deemed as the angle of recovery from 90° bending for a sheet from which the fiber is produced by cutting.

The tensile elasticity modulus of the shape-retaining fiber according to the present invention is preferably 16 to 50 GPa, and more preferably 20 to 50 GPa. When the tensile elasticity modulus is less than 16 GPa, it becomes difficult to provide sufficient shape retainability, and when the tensile elasticity modulus exceeds 50 GPa, the fiber becomes breakable and in some cases, cannot not woven into a fabric.

The tensile elasticity modulus of the shape-retaining fiber is deemed as the tensile elasticity modulus of the sheet from which the fiber is produced by cutting. The tensile elasticity modulus of the sheet can be measured in accordance with JIS K7161. Details of the measurement will be described later.

As will be described later, the shape-retaining fiber according to the present invention can be obtained for instance by cutting a sheet that includes a uniaxially stretched polyethylene film. By adjusting the stretch ratio for uniaxially stretching, the tensile elasticity modulus of the shape-retaining fiber can be adjusted. The length of the elongated molecular chains of polyethylene and therefore tensile elasticity modulus of the stretched polyethylene film increase as the stretch ratio for uniaxial stretching becomes high.

The shape-retaining fiber according to the present invention exhibits high thermal conductivity in lengthwise direction; for example, thermal conductivity in lengthwise direction can be 5 to 30 W/mK, and further to 10 to 30 W/mK.

The thermal conductivity of the shape-retaining fiber is deemed as the thermal conductivity of the sheet from which the fiber is produced by cutting. The thermal conductivity of sheet is measured with regard to a test sample prepared by cutting the sheet into a strip which is 30 mm in length (stretch direction) and 3 mm in width and depositing a light-receiving film (Bi thin film) on one side of the stretched film to prepare a test sample. The test sample is then measured for thermal diffusivity a at 25° C. with a thermal diffusivity meter using the AC calorimetric method. On the other hand, the sheet is measured for specific heat Cp and density ρ by differential scanning calorimetry. The measured values are substituted into the following equation to find thermal conductivity lambda (unit: W/mK):

$$\text{Thermal conductivity } \lambda = \alpha \times \rho \times Cp$$

The thermal conductivity of the shape-retaining fiber in the lengthwise direction may be adjusted by the stretch ratio for uniaxial stretching carried out in the fiber production process (later described). Uniaxial stretching causes the polyethylene contained in the shape-retaining fiber to exhibit anisotropy between the stretch direction and the direction perpendicular to the stretch direction. Anisotropy increases with increasing stretch ratio for uniaxial stretching. Polymers that exhibit anisotropy (especially crystalline polymers) exhibit improved thermal conductivity in stretch direction compared to polymers that exhibit isotropy.

The shape-retaining fiber according to the present invention may be used in various applications. It can be used as a stopper like a wire, and when it is used as fiber for fabrics, shape retainability can be conferred to the fabric.

Specific examples of the applications of the shape-retaining fiber according to the present invention include clothes (shirts, suits, blazers, blouses, coats, jackets, blousons, jumpers, vests, dresses, trousers, skirts, pants, underwears (slips, petticoats, camisoles, and brassieres), socks, Japanese clothes, obi material, and gold brocades), cool feeling clothes, neckties, handkerchiefs, tablecloths, gloves, footwears (sneakers, boots, sandals, pumps, mules, slippers, ballet shoes, and kung-fu shoes), mufflers, scarfs, stoles, eye masks, towels, pouches, bags (tote bags and shoulder bags, handbags, pochettes, shopping bags, eco-bags, rucksacks, daypacks, sport bags, Boston bag, waist bags, waist pouches, clutch bags, vanity bags, accessory pouches, mother bags, party bags, and kimono bags), porch/cases (tissue cases, glasses cases, pen cases, book jackets, game porches, key cases, and holders for a commuter pass), wallets, headgears (hats, caps, caskets, hunching caps, ten-gallon hats, flop hats, sun visors, berets, helmets, and hoods), belts, aprons, ribbons, corsages, brooches, curtains, wallcloths, seat covers, sheets, quilts, quilt covers, blankets, pillows, pillow cases, sofas, beds, baskets, lapping materials, room decorations, car accessories, artificial flowers, masks, dressings, ropes, nets, fishing nets, cement reinforcing materials, screen printing meshes, filters (for cars and household appliances), meshes, sheets (agricultural sheets and leisure sheets), textiles (for public works and construction works), and filtration cloths. Note that the above articles may be made up of the shape-retaining fiber according to the present invention entirely or only in part where shape retainability is required.

The shape-retaining fiber according to the present invention possesses characteristics of light weight, toughness, easy deformation, etc. Accordingly, the shape-retaining fiber according to the present invention and a fabric made of the same can be used in reinforcing materials, where glass fibers, carbon fibers, aramid fibers etc. have been employed. Specifically, the shape-retaining fiber according to the present invention and a fabric made of the same can be for used to reinforce airplanes, automobiles, trains, etc., as well as in their accessories. In particular, the shape-retaining fiber according to the present invention and a fabric made of the same can be used in car bodies, air bags, seat belts, doors, bumpers, cockpit modules, console boxes, glove boxes, etc., of cars.

3.2 Process for Producing Shape-Retaining Fiber

A process of the present invention for producing a shape-retaining fiber includes the steps of: 1) obtaining a sheet including a polyethylene film stretched (preferably uniaxially) at a certain stretched ratio (stretched polyethylene film); and 2) cutting the sheet by the method called micro-slitting. Because high-density polyethylenes are sometimes hard to be melt-spun, the film is preferably defibrated (cut) into fibers.

The stretched polyethylene film is obtained by uniaxially stretching an original film containing polyethylene. The polyethylene may be either ethylene homopolymer or ethylene/α-olefin copolymer as described above. The density, molecular weight distribution and other properties of the polyethylene are the same as those described above. Note that as the density of polyethylene may increase when it is crystallized by stretching, the density of the polyethylene contained in the original film is preferably 940 kg/m$^3$ or more. The original film may further contain thermoplastic resins other than polyethylene and/or additives.

The thickness of the stretched polyethylene film is preferably 20 to 100 μm. The thickness of the polyethylene film may correspond to the dimension of the short side of a cross-section of the resultant shape-retaining fiber.

The stretch ratio for uniaxial stretching is set to a level sufficient to confer desired tensile elasticity modulus to the stretched polyethylene film. The tensile elasticity modulus of the stretched polyethylene film increases with increasing stretching ratio for uniaxial stretching. The tensile elasticity modulus of the stretched polyethylene film is the same as that of the shape-retaining fiber described above; it is preferably 16 to 50 GPa, and more preferably 20 to 50 GPa. When the tensile elasticity modulus of the shape-retaining film is less than 16 GPa, it becomes difficult to provide sufficient shape retainability, and when the tensile elasticity modulus exceeds 50 GPa, the film may become breakable. The tensile elasticity modulus of the stretched film can be measured in accordance with JIS K7161 described above.

The stretched film may be subjected to annealing treatment where necessary. Annealing treatment can be carried out by bringing the stretched sheet in contact with a heating roll.

The sheet to be cut into shape-retaining fibers may be the stretched polyethylene film itself or a laminated film in which an additional layer is laminated onto the stretched polyethylene film. The additional layer may be one that confers good appearance to the shape-retaining fibers to be produced. The layer for conferring good appearance is, for example, a layer having metallic luster or hue.

For example, a metal layer may be laminated onto the stretched polyethylene film. The metal layer may be deposited by any of the methods known in the art, such as vapor deposition or sputtering.

The shape-retaining fiber is produced by cutting the polyethylene film or a laminate of the polyethylene film and an additional layer by micro-slitting. Micro-slitting is the process whereby a sheet to be cut is fed into a micro slitter equipped with a slitting blade such as laser blade or rotary shear (blade) and is cut into fibers.

The direction in which the sheet is cut into fibers should be parallel to the direction in which molecular chains of polyethylene in the stretched polyethylene film are fully stretched (primary stretch direction). This is to confer shape retainability and thermal conductivity to the resultant shape-retaining fibers.

The slit width of the slitting blade is preferably 100 to 500 The slit width corresponds to the dimension of the long side of a cross-section of the shape-retaining fiber.

3.3 Fabric

A fabric according to the present invention refers to a fabric constructed in film form by interlacing fibers over and under each other in a regular pattern, wherein some or all of the fibers are shape-retaining fibers according to the present invention. By employing the shape-retaining fibers according to the present invention for some or all of the fibers of a fabric, it is possible to confer shape retainability to the fabric.

There are no particular limitations on the weave construction of the fabric according to the present invention; it may be formed with a fundamental weave construction such as plain weave, diagonal weave or satin weave, or may be formed with a stereoscopic construction such as weft knit, warp knit, circular knit or cross knit.

The fabric according to the present invention may have three-dimensional structure. A fabric having three-dimensional structure refers to a fabric in which fibers are woven in two dimensions as well as in the thickness of the fabric to provide stereoscopic form.

Among fibers of the fabric having three-dimensional structure, at least some or all of the fibers woven or knitted along the film thickness are preferably the shape-retaining fibers according to the present invention. As described above, the shape-retaining fiber according to the present invention exhibits high thermal conductivity in the length direction. Thus, when the shape-retaining fibers according to the present invention are oriented in the thickness direction of the fabric, the fabric exhibited increased thermal conductivity in thickness direction.

Examples of the fabric having three-dimensional structure are disclosed for instance in JP-A No. 2001-513855. This literature discloses three-dimensional fabrics that have two pairs of mutually perpendicular lateral threads running through a plane and vertical threads running in thickness direction. By replacing the vertical threads by the shape-retaining fibers according to the present invention, thermal conductivity in thickness direction increases.

The shape-retaining fiber according to the present invention may be processed into a twisted yarn. There are no particular limitations on the method of obtaining a twisted yarn. Specific examples of the method of obtaining a twisted yarn include: twisting a single yarn of the shape-retaining fiber according to the present invention; 2) twisting together a plurality of single yarns of the shape-retaining fiber according to the present invention; 3) twisting together a single yarn of the shape-retaining fiber according to the present invention and one or more different yarns; 4) twisting a single yarn of the shape-retaining fiber according to the present invention and winding the same around a core yarn; 5) winding a plurality of single yarns of the shape-retaining fiber according to the present invention around a core yarn; 6) winding a single yarn of the shape-retaining fiber according to the present invention and one or more different yarns around a core yarn; and 7) twisting together one or more different yarns and winding the same around a single yarn of the shape-retaining fiber according to the present invention (core yarn). Note that the obtained twisted yarn may be woven into a fabric. By turning the shape-retaining fiber into a twisted yarn, the fibers contained in the twisted yarn have randomized lengths. Thus, when the shape-retaining fiber according to the present invention in the form of twisted yarn is woven into a fabric, the fabric exhibits increased thermal conductivity in film thickness direction. By processing the shape-retaining fiber into a twisted yarn, it is more easily made into a fabric.

The shape-retaining fibers according to the present invention may be bundled into micro-multifilaments. Preferably, the fibers to be bundled into micro-multifilaments are generally split into fine, fibers of the order of several denier each. By weaving a fabric from the micro-multifilaments, it is possible to adjust the fabric's texture and transparency.

There are no particular limitations on the density of the fabric according to the present invention. Increased density of the shape-retaining fiber leads to increased thermal conductivity.

The fabric according to the present invention may be used in a variety of applications; for example, clothes in which it is used exhibit high heat dissipation.

4.1 Anisotropic Heat-Conductive Film

An anisotropic heat-conductive film according to the present invention is obtained by stretching (preferably uniaxially stretching) a film containing polyethylene at a certain high stretch ratio or above.

The polyethylene contained in the anisotropic heat-conductive film according to the present invention is the same as that contained in the shape-retaining film described above. That is, it may be either ethylene homopolymer or ethylene/α-olefin copolymer. The density, molecular weight distribution and other properties of the polyethylene are the same as those described above.

Such an anisotropic heat-conductive film obtained by stretching (preferably uniaxially stretching) a film containing polyethylene (preferably a film consisting substantially of polyethylene) at a certain high stretch ratio or above exhibits high tensile elasticity modulus in X direction and low tensile elasticity modulus in Y direction that runs substantially perpendicularly to X direction.

When the anisotropic heat-conductive film according to the present invention is a uniaxially stretched film, X direction corresponds to uniaxially stretching direction, and Y direction to a direction that runs substantially perpendicularly to the uniaxially stretching direction. The term "substantially perpendicularly" as used herein encompasses not only substantially 90° intersection, but also 90±15° intersections. The uniaxially stretching direction for the anisotropic heat-conductive film according to the present invention can be confirmed as the direction in which molecular chains of polyethylene have been fully stretched, as observed for instance by optical microscopy.

The tensile elasticity modulus in X direction (high tensile elasticity modulus direction) of the anisotropic heat-conductive film is preferably 6 to 50 GPa, more preferably 12 to 50 GPa, still more preferably 12 to 40 GPa, and most preferably 20 to 40 GPa. When the tensile elasticity modulus in X direction is less than 6 GPa, it becomes difficult to provide sufficient shape retainability or high thermal conductivity, and when the tensile elasticity modulus in X direction exceeds 50 GPa, the film may become breakable.

The tensile elasticity modulus in Y direction (low tensile elasticity modulus direction) of the anisotropic heat-conductive film is preferably less than 6 GPa, and more preferably 5 GPa or less. When the tensile elasticity modulus in Y direction is 6 GPa or more, thermal conductivity in Y direction increases, which results in reduced anisotropy of thermal conductivity. The tensile elasticity modulus in Y direction of the anisotropic heat-conductive film depends on the type of resin contained therein as a primary component; it does not change largely according to the stretch ratio (stretch direction in X direction).

The tensile elasticity modulus in X direction of the anisotropic heat-conductive film is adjusted by the stretch ratio. For example, when the stretch ratio is increased, it is possible to increase the tensile elasticity modulus in X direction (stretch direction) of the anisotropic heat-conductive film.

The tensile elasticity modulus of the anisotropic heat-conductive film can be measured in accordance with JIS K7161 described above. The tensile elasticity modulus in X direction of the anisotropic heat-conductive film is measured as follows: 1) A test specimen is prepared by cutting the film into a strip which is 10 mm in width (dimension in the direction perpendicular to the film stretch direction; Y direction) and 120 mm in length (dimension in the film stretch direction; X direction); and 2) this test specimen is measured for tensile elasticity modulus (X direction) in accordance with JIS K7161 using a tensile tester under the following condition: chuck-to-chuck distance=100 mm, and tensile rate=100 mm/min.

The tensile elasticity modulus in Y direction can be measured in the same manner as described above except that: 1) a strip test specimen is prepared which is 10 mm in width (dimension in the stretch direction of the stretched film; X direction) and 120 mm in length (dimension in the direction perpendicular to the stretch direction of the stretched film; Y direction); and 2) this test specimen is measured for tensile elasticity modulus in the direction perpendicular to the stretch direction (Y direction). In each case measurement of tensile elasticity modulus can be made at 23° C. and 55% humidity.

Since the anisotropic heat-conductive film according to the present invention exhibits high tensile elasticity modulus in X direction, it has exhibits superior shape retainability when bent about an axis parallel to Y direction. The angle of recovery from 90° bending for the anisotropic heat-conductive film, when bent about an axis parallel to Y direction, is 12° or less, preferably 8° or less. For its high shape retainability, the anisotropic heat-conductive film according to the present invention can be accommodated in bent or folded state even in a small, crowded space around heat sources in an electronic or other device. Moreover, after placement around heat sources, the anisotropic heat-conductive film can retain the same shape as originally disposed. This prevents possible troubles such as device breakages due to displacement of the devices around the heat sources, which is caused by deformation of the anisotropic heat-conductive film.

The angle of recovery from 90° bending for the anisotropic heat-conductive film can be measured in the same manner as described above. Specifically, the film is cut into a test specimen which is 10 mm in width (dimension in the direction perpendicular to the film stretch direction; Y direction) and 50 mm in length (dimension in the film stretch direction; X direction). In the same manner as described above, the test specimen is bent at 90°, the bending axis being parallel to Y direction. And then, the bending force is released so that the test specimen is allowed to be separated from a lateral surface of a steel article, and the angle between the test specimen and the lateral surface is measured.

The anisotropic heat-conductive film according to the present invention exhibits high tensile elasticity modulus in X direction (stretch direction) and therefore high thermal conductivity in X direction. The thermal conductivity in X direction (stretch direction) of the anisotropic heat-conductive film according to the present invention exceeds 5.0 W/mk. The anisotropic heat-conductive film according to the present invention thereby exhibits high thermal conductivity even when heat-conductive fillers or other agents are not contained. Accordingly, the anisotropic heat-conductive film according to the present invention is soft compared to conventional heat-conductive films containing heat-conductive fillers or agent, and exhibit sufficient thermal conductivity.

The anisotropic heat-conductive film according to the present invention may contain heat-conductive fillers known in the art for enhanced thermal conductivity, but in this case tends to exhibit reduced flexibility and shape retainability.

The film's anisotropic heat conduction property depend on the ratio of thermal conductivity between X and Y directions ([thermal conductivity in X direction]/[thermal conductivity in Y direction]). Thus, the anisotropic heat-conductive film preferably has a ratio of thermal conductivity between X and Y directions of greater than 1 to 60 or less.

The thermal conductivity in X direction of the anisotropic heat-conductive film according to the present invention is measured as follows: 1) the anisotropic heat-conductive film is cut into a strip sample which is 30 mm in length (stretch direction; X direction) and 3 mm in width (direction perpendicular to stretch direction; Y direction); 2) a light-receiving film (thin Bi film, thickness: approximately 1,000 Å) is deposited on one side of the strip sample to prepare a test sample; 3) the test sample is measured for thermal diffusivity $\alpha(m^2/s)$ at 25° C. in lengthwise direction (X direction) with a thermal diffusivity meter using the AC calorimetric method ("LaserPIT" ULVAC-RIKO, Inc.); 4) the strip sample is measured for specific heat Cp (J/(kg K) and density $\rho$ (kg/m$^3$) by differential scanning calorimetry; and 5) The measured values are substituted into the following equation to find thermal conductivity $\lambda$ (W/mK):

$$\text{Thermal conductivity } \lambda = \alpha \times \rho \times Cp$$

The thermal conductivity in Y direction of the anisotropic heat-conductive film may be measured in the same manner as described above except that: another strip test specimen is prepared which is 30 mm in length (dimension in the direction perpendicular to stretch direction; Y direction) and 3 mm in width (dimension in stretch direction; X direction); and this test specimen is measured for thermal diffusivity in the lengthwise direction (Y direction).

The thickness of the anisotropic heat-conductive film is preferably 20 to 100 µm, and more preferably 30 to 40 µm. When the thickness of the anisotropic heat-conductive film is less than 20 µm, the film becomes susceptible to breakage when accommodated in bent or folded state. On the other hand, when the thickness of the anisotropic heat-conductive film exceeds 100 µm, the film becomes rigid enough not to be easily accommodated in folded state in a small space inside an electronic or other device.

Theoretically, the shape of the anisotropic heat-conductive film may be determined based on the ratio of thermal conductivity between X and Y directions. The ratio of dimension L1 in X direction (high tensile elasticity modulus direction) to dimension W1 in Y direction (low tensile elasticity modulus direction) of the anisotropic heat-conductive film, L1/W1 ratio, is preferably 60 or less. When the L1/W1 ratio exceeds 60, heat dissipation fails because the heat generated from the heat sources cannot be conducted to an end in X direction of the anisotropic heat-conductive film. Moreover, when W1 is too small, it is not possible to prevent heat from being conducted in Y direction of the anisotropic heat-conductive film.

It should be noted that the shape of the anisotropic heat-conductive film is actually affected by the heat source temperature and physical relationships between the heat source and heat dissipator, as will be described below. By way of example, when it is assumed that a 100° C. heat source is placed at a position corresponding to the center of the anisotropic heat-conductive film and heat is dissipated (through a dissipator) from both ends in X direction of the anisotropic heat-conductive film at room temperature (approximately 23° C.), heat can be selectively diffused in X direction and less heat can be diffused in Y direction in the case where the L1/W1 ratio is set to 2.0 or less, preferably 1.9 or less.

The anisotropic heat-conductive film according to the present invention thus exhibits different thermal conductivities between directions X and Y, and therefore is preferably cut out in a shape such that the L1/W1 ratio falls within any of the above ranges. An anisotropic heat-conductive film cut out in such a shape can prevent heat from being conducted in Y direction (low tensile elasticity modulus direction) while allowing heat to be conducted in X direction (high tensile elasticity modulus direction).

Moreover, the ratio of dimension L1 in X direction (high tensile elasticity modulus direction) to dimension W1 in Y direction (low tensile elasticity modulus direction) of the anisotropic heat-conductive film, L1/W1 ratio, is preferably greater than 1.0, and more preferably 1.6 or more. When dimension W1 of the anisotropic heat-conductive film is too large (relative to dimension L1) where there is only a limited space for the anisotropic heat-conductive film around heat sources in an electronic or other device, it becomes difficult to accommodate the anisotropic heat-conductive film around the heat sources.

The anisotropic heat-conductive film can be rectangular or other shape. Dimension L1 of the anisotropic heat-conductive film indicates a maximum dimension in X direction, and dimension W1 indicates a maximum dimension in Y direction.

The dimensions of the anisotropic heat-conductive film in X and Y directions can be appropriately changed depending on the heat source temperature. When the heat source temperature is high, the heat conducting area is enlarged and therefore the dimensions in X and Y directions are enlarged while keeping the L1/W1 ratio within the above range. On the other hand, when the heat source temperature is low, the heat conducting area is narrowed and therefore the dimensions in X and Y directions are shortened while keeping the L1/W1 ratio within the above range. In either case, it is only necessary for the dimension of the anisotropic heat-conductive film in X direction to be long enough to allow heat to be conducted at least to the heat dissipator.

4.2 Process for Producing Anisotropic Heat-Conductive Film

As with the shape-retaining film described above, the anisotropic heat-conductive film according to the present invention can be obtained the by the process including the steps of: obtaining the above-described original film containing polyethylene; and stretching (preferably uniaxially stretching) the original film at a certain stretch ratio or above.

As described above, the polyethylene contained in the original film is substantially the same as the polyethylene contained in the shape-retaining film described above. Namely, the polyethylene may be either ethylene homopolymer or ethylene/$\alpha$-olefin copolymer. Note that as the density of polyethylene may increase when it is crystallized by stretching, the density of the polyethylene contained in the original film is preferably 940 kg/m$^3$ or more. The original film may further contain thermoplastic resins other than polyethylene and/or additives.

The stretch ratio is 12 or above, more preferably 15 or more, and still more preferably 20 to 30. When the stretch ratio is less than 12, tensile elasticity modulus does not rise to a sufficient level, resulting failure to provide sufficient shape retainability and high thermal conductivity.

4.3 Applications of Anisotropic Heat-Conductive Film

As described above, the anisotropic heat-conductive film according to the present invention exhibits high shape retainability and thermal conductive, as well as is easy to be accommodated due to its flexibility. The anisotropic heat-conductive film according to the present invention is thus suitably used in electronic devices, particularly in heat dissipation devices used in electronic devices that have inadequate space around heat sources. With such a heat dissipation device, it is possible to effectively conduct heat from the heat sources to the dissipator while preventing the heat from conducting to heat-vulnerable circuits.

Examples of the electronic devices to which the anisotropic heat-conductive film according to the present invention is applicable include household appliances, lightings, PCs, cellular phones, smart phones, digital cameras, game machines, electronic papers, electric vehicles, and hybrid cars. There are no particular limitations on the heat source in the electronic devices; examples thereof include transistors, CPUs, ICs, LEDs, and power devices.

The anisotropic heat-conductive film according to the present invention exhibits good shape retainability and high thermal conductivity as well as consists substantially of resin and, therefore, offers good cool feeling and texture. Accordingly, the anisotropic heat-conductive film according to the present invention can be used not only in the above-mentioned electronic devices but in daily needs such as clothes (suits, work clothes), masks, hats, and bed clothings.

Moreover, the anisotropic heat-conductive film according to the present invention exhibits good flexibility and can consist substantially of resins that have almost the same cooling shrinkage, and therefore can be used in cryogenic applications. Specific examples thereof include components of connectors (e.g., valves) or gloves used for transportation, storage and handling of liquid natural gas or liquid hydrogen; components of low-temperature parts of linear motor cars; frozen storage containers for bodily fluids such as blood, bone marrow fluid and sperm, and cells; components of superconductivity magnetic resonance equipment; components used for rockets and space transportation systems; and components of ultrahigh-density memories, medical diagnostic equipment, accelerators, and nuclear fusion reactors.

Among other applications, the anisotropic heat-conductive film according to the present invention is suitably used in heat dissipation devices for electronic devices incorporated with heat sources such as heat generating elements. Namely, a heat dissipation device according to the present invention includes the anisotropic heat-conductive film for conducting heat generated from a heat source, and a heat dissipator for removing the heat conducted through the anisotropic heat-conductive film.

The heat dissipator is preferably disposed at one or both ends in X direction (high tensile elasticity modulus direction) of the anisotropic heat-conductive film. Alternatively, multiplicity of heat dissipators may be disposed in the plane of the anisotropic heat-conductive film along X direction, in addition to the end(s) in X direction (high tensile elasticity modulus direction) of the anisotropic heat-conductive film. This improves heat dissipation efficiency of the heat dissipation device.

There are no particular limitations on the heat dissipator, and any of the heat dissipators known in the art can be employed. Examples thereof include cooling devices such as cooling fans, cooling pipes and large-area members made of materials having high thermal conductivity such as metal (e.g., radiator plates and heat sinks). The heat dissipator in an electronic device may be, for example, the device's housing itself.

Such a heat dissipation device can be manufactured with any of the methods in the art; it can be obtained by coupling the anisotropic heat-conductive film according to the present invention to the heat dissipator by any of the methods known in the art. Examples of the method of coupling the anisotropic heat-conductive film to the heat dissipator include: thermally fusing the film to the heat dissipator; bonding the film to the heat dissipator with any of the adhesives known in the art; and clamping the film with a securing means provided on the heat dissipator.

The heat source and anisotropic heat-conductive film do not necessary have make contact with each other; however, they preferably make contact with each other for enhanced heat dissipation efficiency.

As described above, a preferred physical relationship among the anisotropic heat-conductive film, heat source and heat dissipator may be theoretically determined based on the ratio of thermal conductivity between X and Y directions. Thus, the L2/W2 ratio is preferably 30 or less, where L2 is the distance between the heat dissipator and the center of a projection of the heat source on the anisotropic heat-conductive film (or the center of the contact area between the anisotropic heat-conductive film and heat source) in X direction of the anisotropic heat-conductive film, and W2 is the distance across the anisotropic heat-conductive film in Y direction at the center of the projection or contact area (see FIGS. 4A and 4B). When the L2/W2 ratio exceeds 30, it becomes difficult for heat to be conducted to the heat dissipator disposed at an end in X direction of the anisotropic heat-conductive film due to too large L2, and due to too small W2, it becomes difficult to prevent heat from being conducted through the anisotropic heat-conductive film in Y direction.

It should be noted that the actual physical relationship among the anisotropic heat-conductive film, heat source and heat dissipator varies depending on the heat source temperature and surrounding temperature. By way of example, when the anisotropic heat-conductive film is used to dissipate heat generated from a 100° C. heat source at room temperature (approximately 23° C.), the heat can be selectively diffused in X direction and can be hard to be diffused in Y direction in the case where the L2/W2 ratio is set to 1.0 or less, preferably 0.95 or less.

As described above, the anisotropic heat-conductive film according to the present invention exhibits different thermal conductivities between directions X and Y (high and low tensile elasticity modulus directions). Thus, by adjusting the shape of the anisotropic heat-conductive film and/or the physical relationship among the heat source, anisotropic heat-conductive film and heat dissipator such that the L2/W2 ratio falls within any of the above ranges, it is possible to efficiently conduct heat, which is generating from heat sources, through the anisotropic heat-conductive film in X direction to the heat dissipator, and to conduct less heat in Y direction.

Figure 4A:
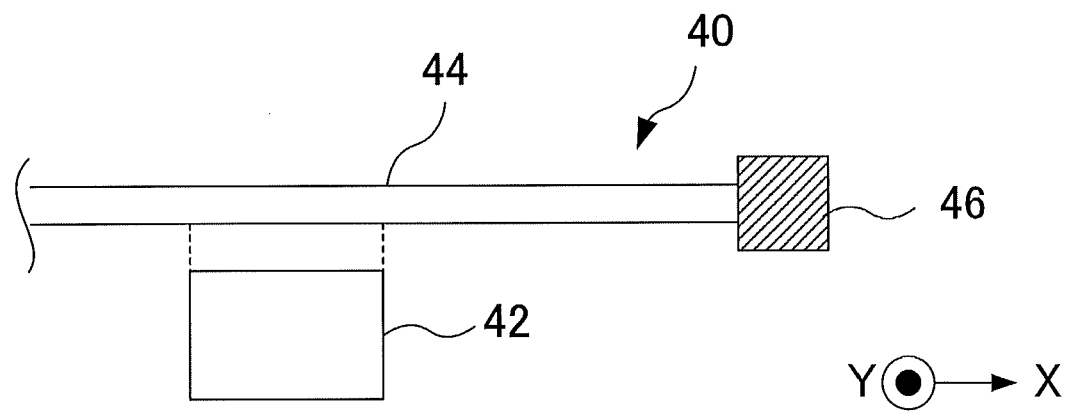
FIGS. 4A and 4B illustrate an example of the physical relationship among a heat source, an anisotropic heat-conductive film, and a heat dissipator.
Figure 4B:
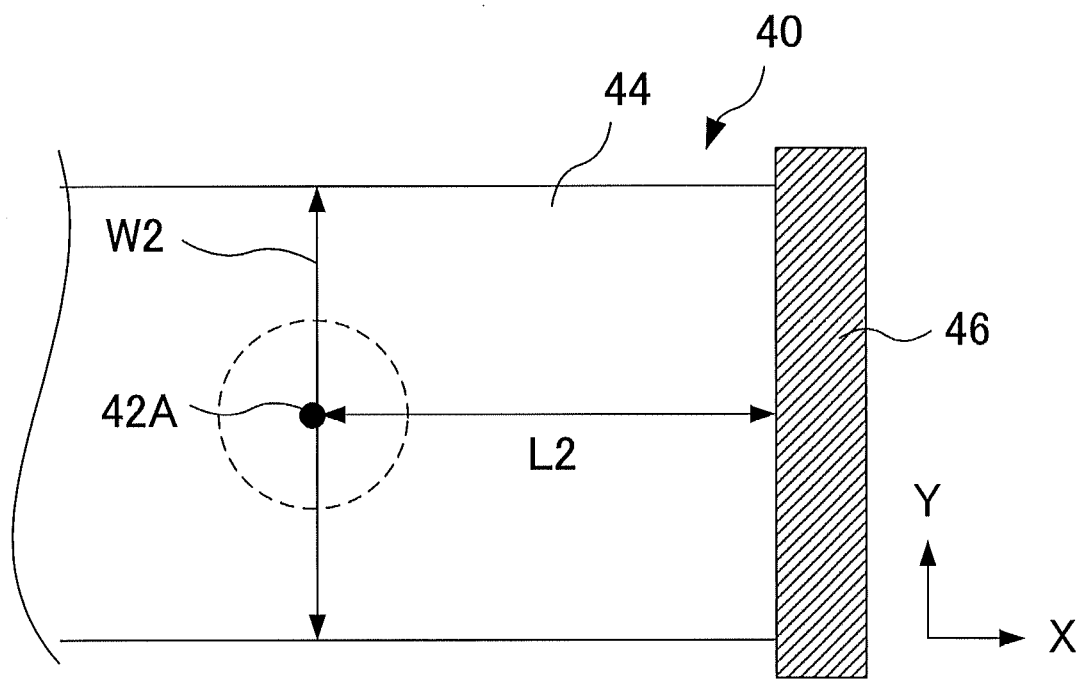

FIGS. 4A and 4B illustrate a physical relationship among a heat source, an anisotropic heat-conductive film and a heat dissipator, where FIG. 4A is a side view and FIG. 4B is a top view. As illustrated in FIGS. 4A and 4B, heat dissipation device 40 that includes anisotropic heat-conductive film 44 and heat dissipator 46 is disposed near heat source 42 such as a heat generating element. The distance between center 42A of a projection of heat source 42 on anisotropic heat-conductive film 44 and heat dissipator 46 in X direction is denoted as L2, and the distance across anisotropic heat-conductive film 44 in Y direction at center 42A of the projection of heat source 42 is denoted as W2.

By disposing heat source 42, anisotropic heat-conductive film 44 and heat dissipator 46 such that L2/W2 falls within any of the above ranges, heat generated from heat source 42 is well conducted through anisotropic heat-conductive film 44 in X direction (high tensile elasticity modulus direction) for removal by heat dissipator 46. On the other hand, since less heat is conducted through anisotropic heat-conductive film 44 in Y direction (low tensile elasticity modulus direction), other electric circuits (not shown) near anisotropic heat-conductive film 44 are less likely to be thermally damaged.

The dimensions of the anisotropic heat-conductive film in X and Y directions can be appropriately changed depending on the heat source temperature. When the heat source temperature is high, the heat conducting area is enlarged and therefore the dimensions in X and Y directions are enlarged while keeping the above ratio within the above range. On the other hand, when the heat source temperature is low, the heat conducting area is narrowed and therefore the dimensions in X and Y directions are shortened.

The L2/W2 ratio is preferably greater than 0.5 in view of the ratio of thermal conductivity between X and Y directions, and more preferably 0.8 or more. When dimension W2 of the anisotropic heat-conductive film is too large (relative to dimension L2) in the case where there is only a limited space for the anisotropic heat-conductive film around heat sources in an electronic or other device, it becomes difficult to accommodate the anisotropic heat-conductive film around the heat sources.

Dimension W2 of the anisotropic heat-conductive film may vary according to the position in X direction. For example, the dimension in Y direction of the anisotropic heat-conductive film may be enlarged at positions around heat-vulnerable components and may be shortened at the other positions.

Figure 5:
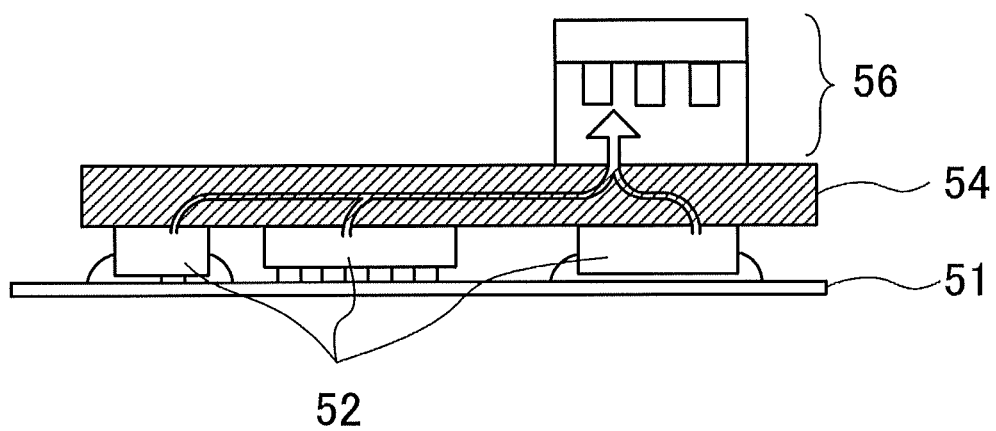
FIG. 5 illustrates one example of the heat dissipation structure according to the present invention in an electronic device.

FIG. 5 illustrates one example of the heat dissipation structure of an electronic device according to the present invention. As illustrated in FIG. 5, heat dissipation structure 50 includes anisotropic heat-conductive film 54 which is disposed so as to contact heat sources 52 (e.g., heat generating elements) disposed on printed circuit board 51 and which is disposed parallel to the surface of printed circuit board 51, and heat dissipator 56 disposed so as to contact the surface of anisotropic heat-conductive film 54, which surface is remote from the surface contacting heat sources 52. Anisotropic heat-conductive film 54 can be the anisotropic heat-conductive film according to the present invention. The lengthwise direction of anisotropic heat-conductive film 54 in FIG. 5 corresponds to X direction (high tensile elasticity modulus direction).

In heat dissipation structure 50, anisotropic heat-conductive film 54 exhibits high thermal conductivity in X direction, and therefore, as indicated by the arrow, heat generated from heat sources 52 flows in X direction and is smoothly conducted to heat dissipator 56. The heat conducted through heat-conductive film 54 is then removed by heat dissipator 56.

Figure 6:
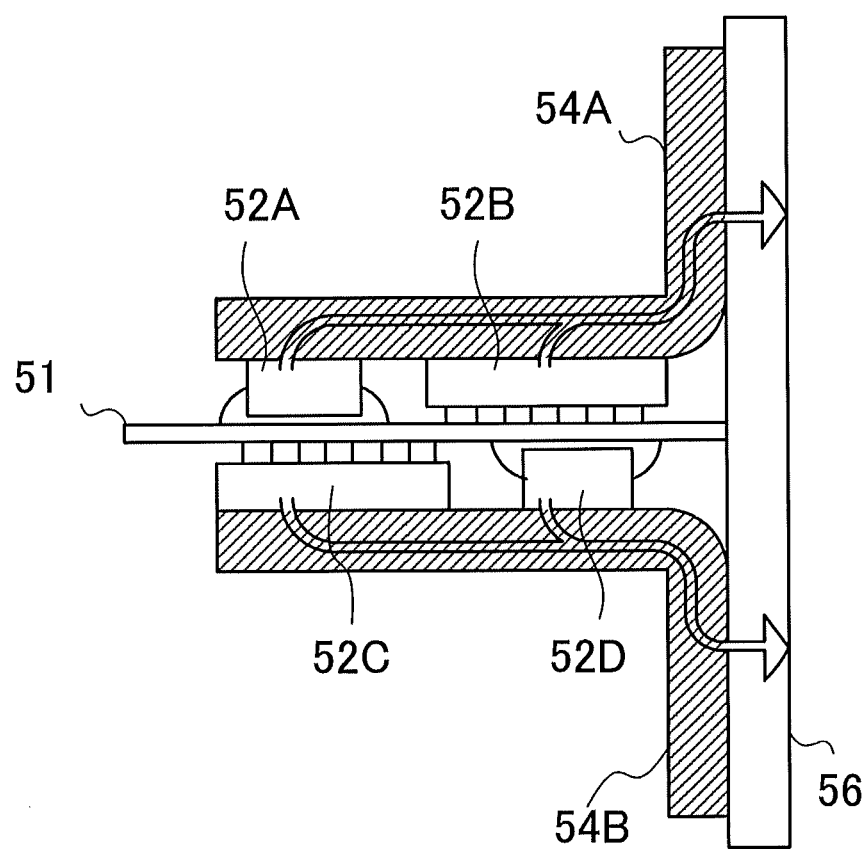
FIG. 6 illustrates another example of the heat dissipation structure according to the present invention in an electronic device.

FIG. 6 illustrates another example of the heat dissipation structure of an electronic device according to the present invention. In FIG. 6, components that have identical shape or function to those illustrated in FIG. 5 are given the same reference signs. As illustrated in FIG. 6, heat dissipation structure 50' includes heat dissipator 56 which is disposed spaced from heat sources 52A to 52D disposed on both sides of printed circuit board 51 and which intersects printed circuit board 51; anisotropic heat-conductive film 54A disposed in a bent state such that heat sources 52A and 52B are coupled to heat dissipator 56; and anisotropic heat-conductive film 54B disposed in a bent state such that heat sources 52C and 52D are coupled to heat dissipator 56. The lengthwise direction of anisotropic heat-conductive films 54A and 54B in FIG. 6 corresponds to X direction (high tensile elasticity modulus direction).

In heat dissipation structure 50', heat generated from heat sources 52A and 52B disposed on one side of printed circuit board 51 is smoothly conducted through anisotropic heat-conductive film 54A in X direction (arrow direction) to heat dissipator 56, where it is removed. Similarly, heat generated from heat sources 52C and 52D disposed on the other side of printed circuit board 51 is smoothly conducted through anisotropic heat-conductive film 54B in X direction (arrow direction) to heat dissipator 56, where it is removed. As described above, anisotropic heat-conductive films 54A and 54B according to the present invention exhibit high flexibility and shape retainability, they can be kept bent as illustrated in FIG. 6.

EXAMPLES

1. Evaluations of Shape-Retaining Films (Examples 1 and 2/Comparative Examples 1 to 5)

Example 1

High density polyethylene (HI-ZEX® HZ5202(B), Prime Polymer Co., Ltd.; density=965 kg/m$^3$, ratio of weight-average molecular weight (Mw) to number-average molecular weight (Mw)=11.3, melt flow index at 190° C.=0.34 g/10 min) was melt-kneaded in an extruder at 260° C., and extruded from a T-die to prepare a 500 μm-thick original film.

The original film was uniaxially stretched at a stretch ratio of 20 while heating it with a heating roll to 120° C. to prepare a 27 μm-thick uniaxially stretched film.

Example 2

A 40 μm-thick uniaxially stretched film was prepared in the same manner as in Example 1 except that the original film prepared in Example 1 was stretched at a stretch ratio of 24 while heating it to 120° C. under radiation of the near infrared spectrum.

Comparative Example 1

A 600 μm-thick film was prepared in the same manner as in Example 1 except that the original film prepared in Example 1 was not stretched.

Comparative Example 2

A 60 μm-thick uniaxially stretched film was prepared in the same manner as in Example 1 except that the original film prepared in Example 1 was stretched at a stretch ratio of 10.

Comparative Example 3

A 35 μm-thick uniaxially stretched film was prepared in the same manner as in Example 1 except that the original film prepared in Example 1 was stretched at a stretch ratio of 15.

Comparative Examples 4 and 5

Commercially-available high density polyethylene sheets prepared by press rolling and stretching of high density polyethylene (FORTE, Sekisui Chemical Co., Ltd., thickness 400 μm, 600 μm) were provided.

The films prepared in Examples 1 and 2 and Comparative Examples 1 to 5 were tested for their tensile elasticity modulus, angle of recovery from 90° bending and surface profile (surface roughness Ra and surface projection interval Sm), and subjected to a post-printing tape peeling test.

1) Tensile Elasticity Modulus

The uniaxially stretched film was cut to prepare a strip test specimen which is 10 mm in width (dimension in the direction perpendicular to the stretch direction of the film) and 120 mm in length (dimension in the stretch direction of polyethylene). The test specimen was measured for tensile elasticity modulus in stretch direction in accordance with JIS K7161 using a tensile tester under the following condition: chuck-to-chuck distance=100 mm, and tensile rate=100 mm/min. Tensile elasticity modulus was measured for additional 5 test specimens in the same manner, and an average value was calculated. The measurements were made at 23° C. and 55% humidity.

2) Angle of Recovery from 90° Bending

Figure 1B:
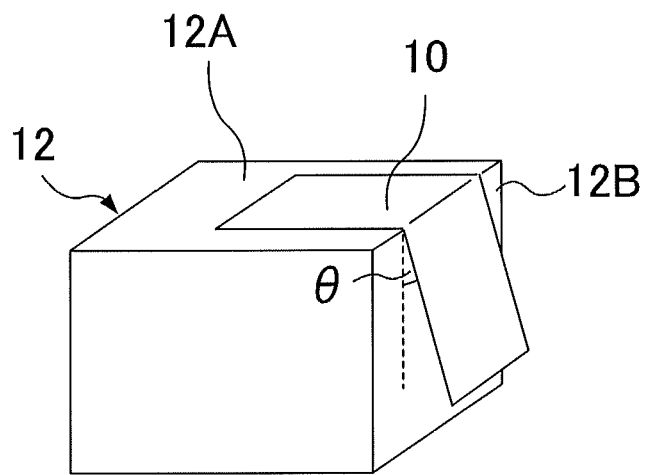

The uniaxially stretched film was cut into a strip test specimen which is 10 mm in width (dimension in the direction perpendicular to the stretch direction of polyethylene) and 50 mm in length (dimension in stretch direction). As illustrated in FIG. 1A, test specimen 10 was bent and pressed against a right-angled corner (constituted by two each intersecting surfaces 12A and 12B) of steel article 12 for about 5 seconds while care was taken not to leave any gap between them. In this way test specimen 10 was bent about an axis parallel to the width direction of the test specimen at 90° and kept bent. As illustrated in FIG. 1B, with test specimen 10 secured to surface 12A, the bending force was then released so that test specimen 10 was allowed to be separated from surface 12B, and angle θ between test specimen 10 and surface 12B was measured to find the angle of recovery from bending. The measurements were made at 23° C. and 55% humidity.

Angle θ between one side of bent test specimen 10 and surface 12B of steel article 12, when the test specimen 10 is folded over on itself with the one side of the test specimen 10 on the steel article 12, was measured 3 times. Moreover, angle θ between the other side of bent test specimen 10 and surface 12B of steel article 12, when the test specimen 10 is folded over on itself with the other side of the test specimen 10 on the steel article 12, was measured 3 times. An average of the total 6 measurements was recorded as the angle of recovery from 90° bending.

3) Surface Profile (Surface Roughness Ra and Surface Projection Interval Sm)

Surface roughness Ra and surface projection interval Sm were measured by the contact stylus method using a surface roughness/profile measuring instrument ("SURFCOM 570A" Tokyo Seimitsu Co., Ltd.). A diamond tipped conical stylus was used, which have tip curvature radius R of 5 μm and angle θ of 90°. Measurement conditions were as follows: cutoff=0.8 mm, tracing speed=0.3 mm/second, measurement length=2.5 mm.

Some of the films were observed by SEM on their surface. The SEM observation was performed using scanning electron microscope JSM-6380 (JEOL Co., Ltd.) at 2,000× and at accelerating voltage of 5 kV.

4) Post-Printing Tape Peeling Test (Lattice Cut Test)

Ink adhesion was assessed in accordance with the testing method specified in JIS K5600-5-6 (Testing Methods of Paints—Part 5: Mechanical property of film—Section 6: Adhesion test (Cross-cut test)).

Specifically, the uniaxially stretched film was subjected to corona discharge treatment on the surface such that surface tension becomes 40 dyn/cm. The film was cut into a 100 mm×100 mm square sample to prepare a test specimen. Oil paint ("Ikkainuri House Paint", azure blue, Kanpe Hapio Co., Ltd.) was applied over the surface of the test specimen to a dry thickness of 20 μm with a bar coater and dried at room temperature for over 15 hours.

A matrix of cuts were made through the coating to produce squares. The adhesion of the oil paint coating to the test specimen surface was evaluated by attaching a 24 mm-width cellophane tape (Nichiban Co., Ltd.) to the coating and then peeling the tape off the coating.

Figure 8:
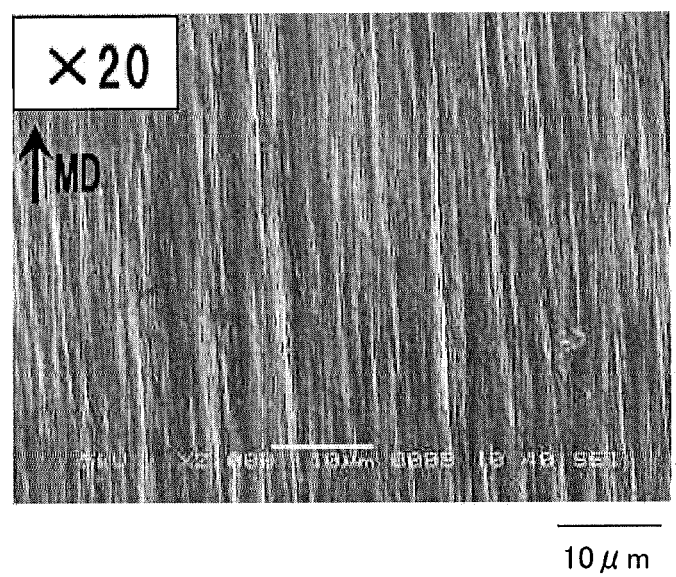
FIG. 8 is an SEM image of a film surface in Example.
Figure 9A:
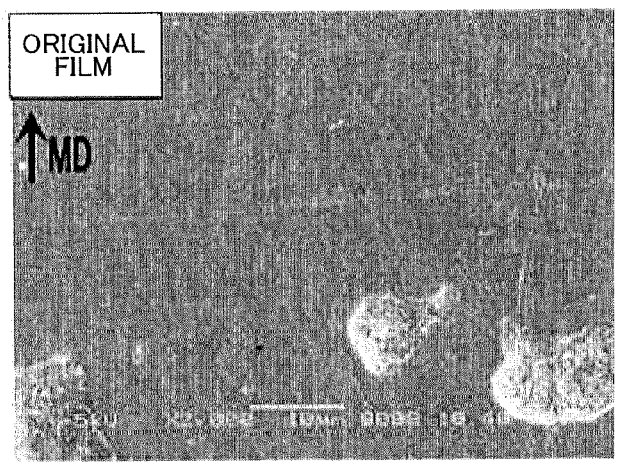
FIGS. 9A to 9C are SEM images of film surfaces in Comparative Examples.
Figure 9B:
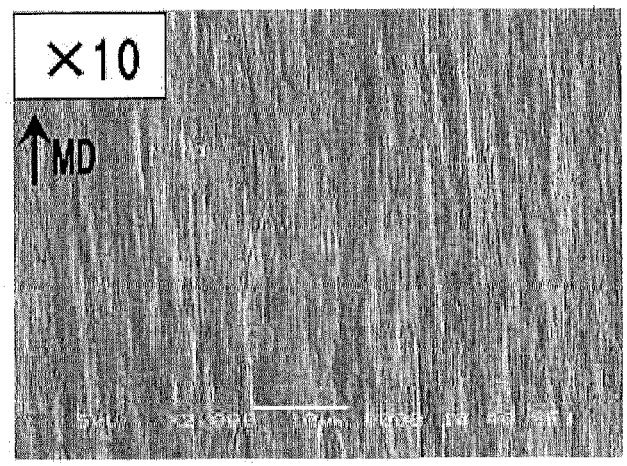
Figure 9C:
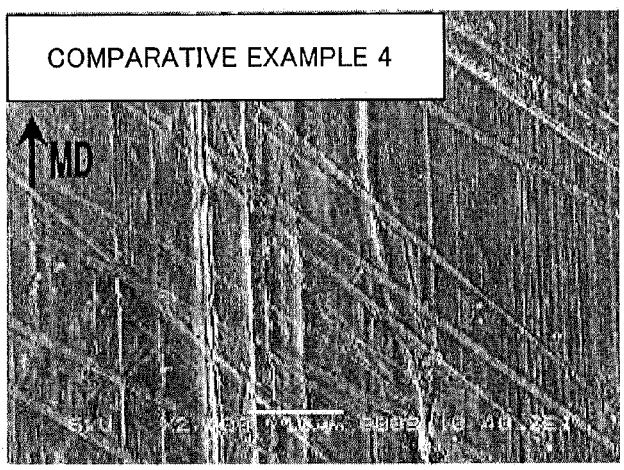

The number of squares peeled off accounts for 35% or less of the total of squares: Good The number of squares peeled off accounts for greater than 35% of the total of squares: Poor Evaluation results for Examples 1 and 2 and Comparative Examples 1 to 5 are given in Table 1. An SEM image of a film surface in Example 1 is shown in FIG. 8, and SEM images of film surfaces in Comparative Examples 1, 2 and 4 are shown in FIGS. 9A to 9C, respectively.

TABLE 1

|  |  | Ex. 1 | Ex. 2 | Comp. Ex. 1 | Comp. Ex. 2 | Comp. Ex. 3 | Comp. Ex. 4 | Comp. Ex. 5 |
|---|---|---|---|---|---|---|---|---|
| Film material |  | HD-PE | HD-PE | HD-PE | HD-PE | HD-PE | HD-PE | HD-PE |
| Manufacturing condition | Stretch ratio (x fold) | 20 | 24 | 1 | 10 | 15 | — | — |
|  | Heating method | Roll heating | Radiation heating | Roll heating | Roll heating | Roll heating | — | — |
|  | Press rolling | No | No | No | No | No | Yes | Yes |
| Evaluation | Thickness (μm) | 27 | 40 | 600 | 60 | 35 | 400 | 600 |
|  | 1) Tensile elasticity modulus (GPa) | 20 | 28 | 1.5 | 7 | 14 | 11 | — |
|  | 2) Angle of recovery from 90° bending(°) | 5 | 3 | 80 | 28 | 10 | 10 | 10 |
|  | 3) Surface profile  Ra (μm) | 0.20 | 0.18 | 0.72 | 0.10 | 0.09 | 0.13 | 0.28 |
|  | Sm (μm) | 158.39 | 108.15 | 133.24 | 252.92 | 154.56 | 154.28 | 133.04 |
|  | 4) Tape peeling test | Good | Good | Poor | Poor | Poor | Nil | Nil |

As seen from Table 1, the uniaxially stretched films prepared in Examples 1 and 2, which were stretched at a stretch ratio of not less than 20, exhibited small angles of recovery from bending and therefore high shape retainability compared to the non-oriented film prepared in Comparative Example 1 and to the uniaxially stretched films prepared in Comparative Examples 2 and 3 which were stretched at a stretch ratio of below 20. It can also be seen that the uniaxially stretched films prepared in Examples 1 and 2 exhibited relatively large surface roughness Ra and therefore high ink adhesion compared to those prepared in Comparative Examples 2 and 3.

Figure 7A:
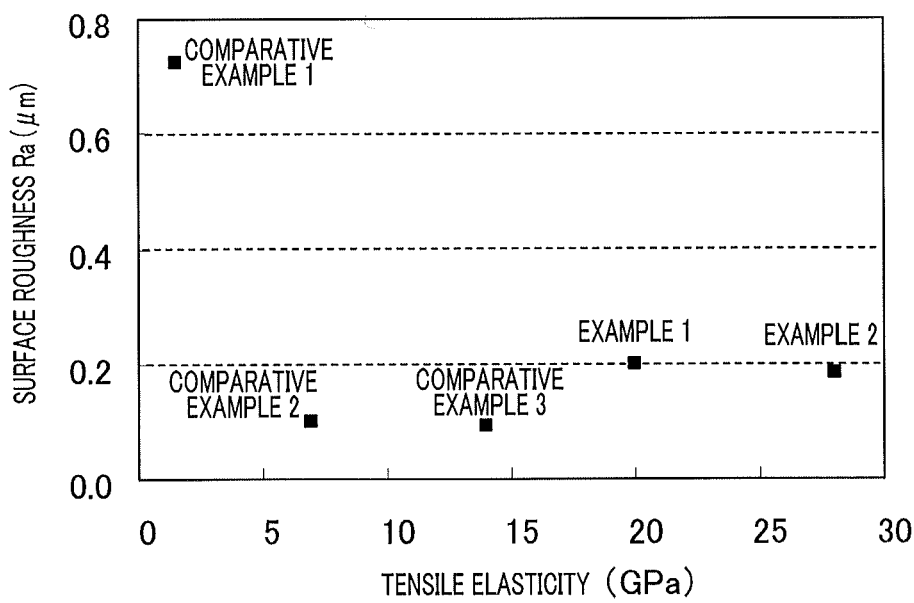
FIGS. 7A and 7B are graphs summarizing the results in Examples and Comparative Examples.
Figure 7B:
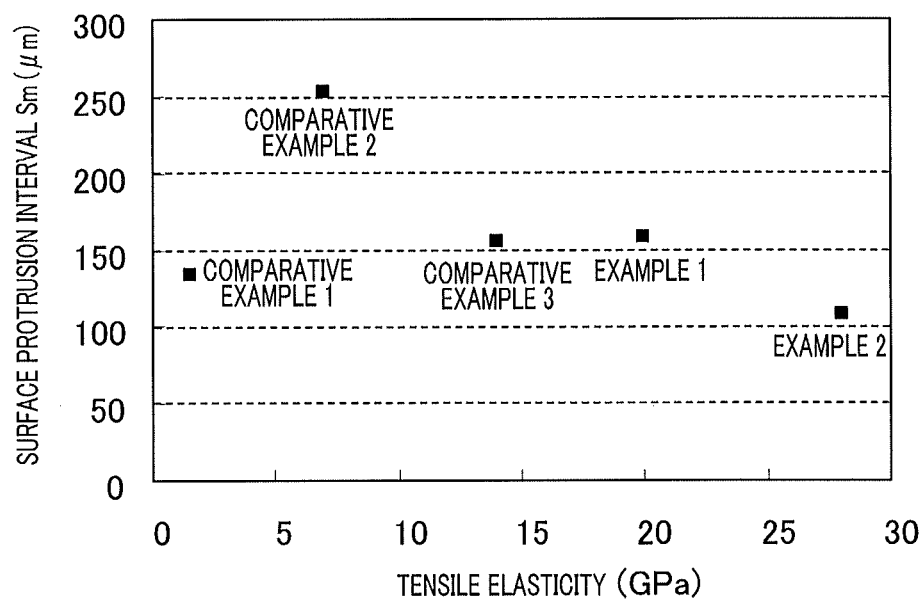

FIGS. 7A and 7B are graphs of surface profile vs. tensile elasticity modulus based on the results of Examples 1 and 2 and Comparative Examples 1 to 3, where FIG. 7A is a graph of surface roughness Ra vs. tensile elasticity modulus, and FIG. 7B is a graph of surface projection interval Sm vs. tensile elasticity modulus. Tensile elasticity modulus is proportional to stretch ratio.

As seen from FIG. 7A, surface roughness Ra increases with increasing tensile elasticity modulus. On the other hand, as seen from FIG. 7B, surface projection interval Sm decreases with increasing tensile elasticity modulus. The net result of this that it can be seen that microscopic irregularities appear more densely with increasing tensile elasticity modulus (stretch ratio). These irregularities are considered to result from changes in the orientation of molecular chains, which is associated with increase in tensile elasticity modulus (stretch ratio).

Larger values for surface roughness Ra and smaller values for surface projection interval Sm observed for the non-oriented film prepared in Comparative Example 1 resulted from the transfer of the surface profile of the cooling roll to a melt cast film when they made contact each other, not from the formation of irregularities due to changes in the orientation of molecular chains.

As shown in FIG. 8, it is observed that the uniaxially stretched film prepared in Example 1, stretched at a stretched ratio of 20, exhibited linear irregularities running in stretch direction. By contrast, it can be seen that almost no irregularities that run in the direction perpendicular to stretch direction were formed on the surfaces of the non-oriented film prepared in Comparative Example 1 (FIG. 9A) as well as on the surface of the film prepared in Comparative Example 2 stretched at a stretch ratio of 10 (FIG. 9B).

It can also be seen that irregularities on the surface of the commercially-available high density polyethylene sheet prepared in Comparative Example 4 (FIG. 9C), which sheet was obtained by roll pressing and roll stretching of polyethylene, were not as many as the ones on the surface of the film prepared in Example 1. This result suggests that since press rolling of high density polyethylene does not entails formation of irregularities, mere slight stretching followed by press rolling does not result in the formation of as many irregularities as the ones formed on the films according to the present invention.

2. Evaluation of Packaging Laminate Films
(Examples 3 to 12/Comparative Examples 6 to 8)

(1) Manufacture of Shape-Retaining Films

1) Shape-Retaining Film 1

High density polyethylene (Novatec HD HB530, Japan Polyethylene Corporation; density=965 kg/m$^3$, weight-average molecular weight (Mw)/number-average molecular weight (Mw)=15.8, melt flow index at 190° C.=0.36 g/10 min) was melt-kneaded in an extruder at 260° C., and extruded from a T-die to prepare an original film.

This original film was uniaxially stretched with a uniaxial roll stretcher at a stretch ratio of 15 to prepare shape-retaining film 1 of 40 μm-thickness made of high density polyethylene.

2) Shape-Retaining Film 2

Shape-retaining film 2 of 35 μm-thickness was similarly prepared except that an original film obtained in the same manner as in 1) above was uniaxially stretched at a stretch ratio of 14.

3) Shape-Retaining Film 3

Shape-retaining film 3 of 50 μm-thickness was similarly prepared except that an original film obtained in the same manner as in 1) above was uniaxially stretched at a stretch ratio of 24.

4) Shape-Retaining Film 4

An original film was prepared as in 1) above except that polyethylene having the following properties was used: density=955 kg/m$^3$, weight-average molecular weight (Mw)/number-average molecular weight (Mn)=10, melt flow index at 190° C.=1 g/10 min.

This original film was uniaxially stretched at a stretch ratio of 11.5 in the same manner as described above to prepare shape-retaining film 4 of 50 μm thickness.

Shape-retaining films 1 to 4 thus prepared were measured for tensile elasticity modulus and angle of recovery from 180° bending in the manners described below. Measurement results are given in Table 2.

Measurement of Tensile Elasticity Modulus

The tensile elasticity modulus of the shape-retaining films was measured in accordance with JIS K7161 described above.

Measurement of Angle of Recovery from 180° Bending

Figure 15A:
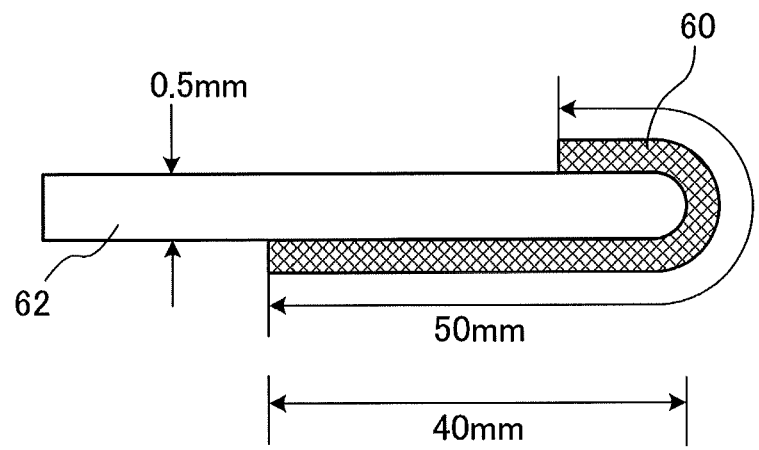
FIGS. 15A and 15B illustrate a method of measuring an angle of recovery from 180° bending.
Figure 15B:
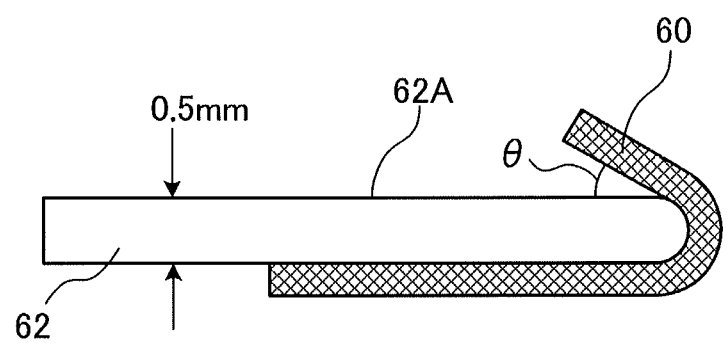

The shape-retaining film was cut into a test specimen which is 10 mm in width (dimension in the direction perpendicular to the direction in which molecular chains of polyethylene are fully stretched (film stretch direction)) and 50 mm in length (direction in which molecular chains of polyethylene are fully stretched (film stretch direction)). As illustrated in FIG. 15A, test specimen 60 was fitted on a 0.5 mm-thick plate 62 to cover the bottom, edge and top surfaces. In this way test specimen 60 was bent at 180°, and kept bent (with a hand) for approximately 30 seconds. Thereafter, as illustrated in FIG. 15B, the bending force was released (by taking the hand off the film). Thirty seconds after releasing, angle θ between top surface 62A of plate 62 and the surface of test specimen 60 was measured. The measurement was made at 23° C. and 55% humidity.

Angle θ between one side of bent test specimen 60 and top surface 62A of plate 62, when the test specimen 60 is folded over on itself with the one side of the test specimen 60 on the plate 62, was measured 3 times. Moreover, angle θ between the other side of bent test specimen 60 and top surface 62A of plate 62, when the test specimen 60 is folded over on itself with the other side of the test specimen 60 on the plate 62, was measured 3 times. An average of the total 6 measurements was recorded as the angle of recovery from 180° bending.

TABLE 2

| | | Shape-retaining film 1 | Shape-retaining film 2 | Shape-retaining film 3 | Shape-retaining film 4 |
|---|---|---|---|---|---|
| Physical properties of source polyethylene | Density (Kg/m$^3$) | 965 | 965 | 965 | 955 |
| | Molecular weight distribution Mw/Mn | 15.8 | 15.8 | 15.8 | 10 |
| | MFR (g/10 min) | 0.36 | 0.36 | 0.36 | 1 |
| Film manufacturing condition | Stretch ratio (x fold) | 15 | 14 | 24 | 11.5 |

TABLE 2-continued

|  |  | Shape-retaining film 1 | Shape-retaining film 2 | Shape-retaining film 3 | Shape-retaining film 4 |
|---|---|---|---|---|---|
| Physical properties of film | Thickness (μm) | 40 | 35 | 50 | 50 |
|  | Tensile elasticity modulus (GPa) | 16 | 14.7 | 23.8 | 7.6 |
|  | Angle of recovery from 180° bending (°) | 25 | 35 | 20 | 60 |

(2) Manufacture of Packaging Laminate Film

Example 3

Packaging laminate film 1 was fabricated in the manner described below using shape-retaining film 1. As illustrated in FIG. 10A, packaging laminate film 1 is a laminate of shape-retaining film 1/aluminum foil/biaxially oriented polypropylene film (OPP)/polyethylene terephthalate film (PET), where an adhesives layer is disposed between each layer.

First, a two-component urethane adhesive ("Takelac" Mitsui Chemicals, Inc., main agent A1143), curing agent A50 and ethyl acetate were mixed in a weight ratio of 9:1:13 to prepare an adhesive.

The adhesive was then applied on one side of a 20 μm-thick biaxially oriented polypropylene film ("PYLEN FILM-OT P2261" Toyobo Co., Ltd.) to a dry thickness of approximately 4 μm with a bar coater and dried for 1 day at room temperature. A 12 μm-thick polyethylene terephthalate film ("S-PET T4200" Toyobo Co., Ltd.) was laminated onto the adhesive layer.

On the other hand, the adhesive was applied on one side of a 7 μm-thick aluminum foil (aluminum foil "A1N30 H-O", Nippon Foil Mfg. Co., Ltd.) in the same manner as described above, and dried. The aluminum foil was laminated onto the other side of the biaxially oriented polypropylene film with the adhesive layer.

The adhesive was then applied on the other side of the aluminum foil in the same manner as described above and dried. Shape-retaining film 1 was laminated onto this adhesive layer to prepare a laminate film.

The adhesive layer in the resultant laminate film was cured at a pressing pressure of 0.1 MPa and heating temperature of 45° C. to prepare packaging laminate film 1 with an actual measurement thickness of 114 μm.

Example 4

Packaging laminate film 2 illustrated in FIG. 10B was prepared in the same manner as in Example 3 except that biaxially oriented polypropylene film (OPP) was not employed. The layer configuration of packaging laminate film 2 is as follows: shape-retaining film 1/aluminum foil/polyethylene terephthalate (PET) film, with actual measurement thickness being 71 μm.

Example 5

Packaging laminate film 3 illustrated in FIG. 10C was prepared in the same manner as in Example 3 except that aluminum foil was not employed. The layer configuration of packaging laminate film 3 is as follows: shape-retaining film 1/biaxially oriented polypropylene film (OPP)/polyethylene terephthalate (PET) film, with actual measurement thickness being 82 μm.

Example 6

Packaging laminate film 4 illustrated in FIG. 10D was prepared in the same manner as in Example 3 except that biaxially oriented polypropylene film (OPP) was not employed and that a 50 μm-thick heat seal layer ("LIX FILM L4102", Toyobo Co., Ltd., linear low density polyethylene film; corona discharge treatment on the interior walls of the scroll) was used. The layer configuration of packaging laminate film 4 is as follows: heat seal layer (LL)/aluminum foil/shape-retaining film 1/polyethylene terephthalate (PET) film, with actual measurement thickness being 125 μm.

Example 7

Packaging laminate film 5 illustrated in FIG. 10E was prepared in the same manner as in Example 3 except that biaxially oriented polypropylene film (OPP) was replaced by shape-retaining film 1. The layer configuration of packaging laminate film 5 is as follows: shape-retaining film 1/aluminum foil/shape-retaining film 1/polyethylene terephthalate (PET) film, with actual measurement thickness being 119 μm.

Example 8

Packaging laminate film 6 illustrated in FIG. 11A was prepared in the same manner as in Example 6 except that shape-retaining film 1 was replaced by shape-retaining film 2 and that polyethylene terephthalate (PET) film was not employed. The dry thickness of the adhesive layer was set to 5 μm. The layer configuration of packaging laminate film 6 is as follows: heat seal layer (LL)/aluminum foil/shape-retaining film 2, with actual measurement thickness being 110 μm.

Example 9

Packaging laminate film 7 illustrated in FIG. 11B was prepared in the same manner as in Example 6 except that aluminum foil was not employed and that shape-retaining film 1 was replaced by shape-retaining film 2. The dry thickness of the adhesive layer was set to 5 μm. The layer configuration of packaging laminate film 7 is as follows: heat seal layer (LL)/shape-retaining film 2/polyethylene terephthalate (PET) film, with actual measurement thickness being 110 μm.

Example 10

Packaging laminate film 8 illustrated in FIG. 11C was prepared in the same manner as in Example 6 except that aluminum foil was not employed and that shape-retaining film 1 was replaced by shape-retaining film 3. The dry thickness of the adhesive layer was set to 5 μm. The layer configuration of packaging laminate film 8 is as follows: heat seal layer (LL)/shape-retaining film 3/polyethylene terephthalate (PET) film, with actual measurement thickness being 125 μm.

Example 11

Packaging laminate film 9 illustrated in FIG. 11D was prepared in the same manner as in Example 9 except that shape-retaining film 2 was replaced by shape-retaining film 4 and that polyethylene terephthalate (PET) film was not employed. The layer configuration of packaging laminate film 9 is as follows: heat seal layer (LL)/shape-retaining film 4, with actual measurement thickness being 102 μm.

Example 12

Packaging laminate film 10 illustrated in FIG. 11E was prepared in the same manner as in Example 9 except that polyethylene terephthalate (PET) film was not employed. The layer configuration of packaging laminate film 10 is as follows: heat seal layer (LL)/shape-retaining film 2, with actual measurement thickness being 93

Comparative Example 6

Packaging laminate film 11 illustrated in FIG. 12A was prepared in the same manner as in Example 3 except that shape-retaining film 1 was replaced by heat seal layer. The layer configuration of packaging laminate film 11 is as follows: heat seal layer (LL)/aluminum foil/biaxially oriented polypropylene film (OPP)/polyethylene terephthalate (PET) film, with actual measurement thickness being 110 μm.

Comparative Example 7

Packaging laminate film 12 illustrated in FIG. 12B was prepared in the same manner as in Example 4 except that shape-retaining film 1 was replaced by heat seal layer. The layer configuration of packaging laminate film 12 is as follows: heat seal layer (LL)/aluminum foil/polyethylene terephthalate (PET) film, with actual measurement thickness being 79

Comparative Example 8

Packaging laminate film 13 illustrated in FIG. 12C was prepared in the same manner as in Example 9 except that shape-retaining film 2 was not employed. The layer configuration of packaging laminate film 13 is as follows: heat seal layer (LL)/polyethylene terephthalate (PET) film, with actual measurement thickness being 63 μm.

The packaging laminate films prepared in Examples 3 to 12 and Comparative Examples 6 to 8 were measured for closability and angle of recovery from bending.

1. Closability

Figure 13A:
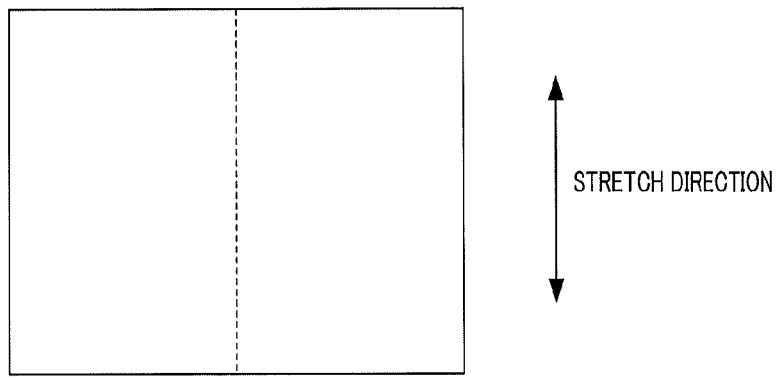
FIGS. 13A to 13C illustrate one example of a method of evaluating closability of the packaging laminate films in Examples/Comparative Examples.
Figure 13B:
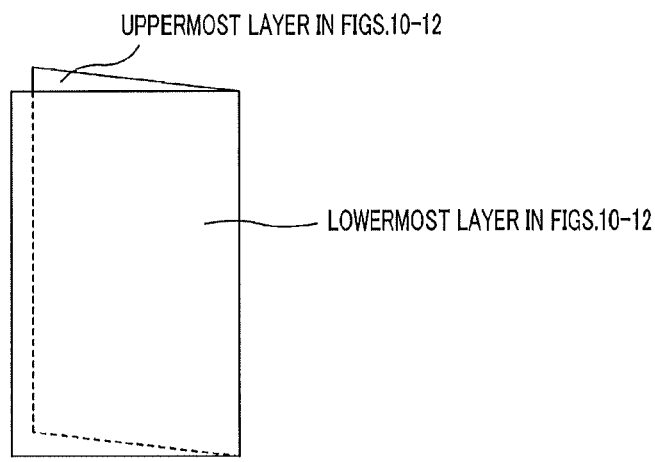
Figure 13C:
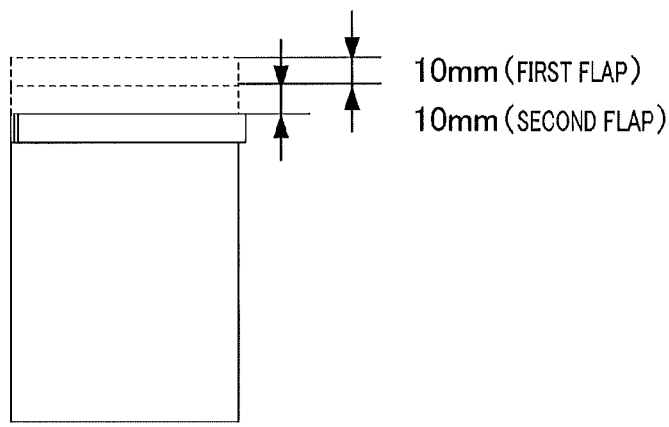

As illustrated in FIG. 13A, the packaging laminate film was cut into an AS sheet whose length is perpendicular to the stretch direction of the shape-retaining film. As illustrated in FIG. 13B, the packaging laminate film was then folded in half lengthwise, with the lowermost layer in FIG. 10, 11 or 12 (leftmost layer of the layer configuration shown in Table 2 or 3) on the outside. Thereafter, as illustrated in FIG. 13C, one edge in the stretch direction of the packaging laminate film was folded over on itself twice 10 cm each along the stretch direction. After keeping the packaging laminate film folded for 1 hour, the folding force was released. The degree to which the packaging laminate film was kept folded was evaluated.

Figure 14:
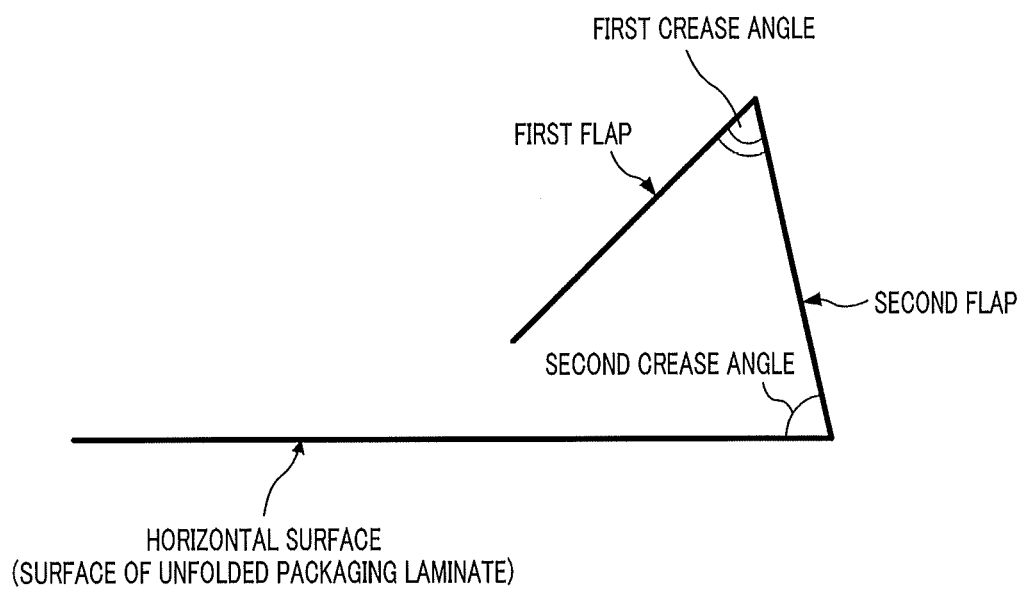
FIG. 14 is a schematic side view of folded points of a packaging laminate film.

FIG. 14 is a schematic side view of folded points of a packaging laminate film. As illustrated in FIG. 14, first crease angle refers to an angle formed between first and second flaps; and second crease angle refers to an angle formed between second flap and horizontal surface (unfolded surface) of the packaging laminate film.

$0°\leq$first crease angle $<30°$, or $0°\leq$second crease angle $<60°$: Good $30°\leq$first crease angle $<70°$, or $60°\leq$second crease angle $<90°$: Fair $70°\leq$first crease angle, or $90°\leq$second crease angle: Poor By way of example, when first crease angle is 60° and second crease angle is 50°, first crease angle is evaluated as "Fair" and second crease angle as "Good". In this case, "Good" takes priority over "Fair" in overall evaluation.

2. Angle or Recovery from 180° Bending

The packaging laminate film was cut into a test specimen which is 10 mm in width (dimension in the direction perpendicular to the film stretch direction of the shape-retaining film) and 50 mm in length (stretch direction of the shape-retaining film). The angle of recovery from 180° bending was then measured in the same manner as that for the shape-retaining film described above (see FIGS. 15A and 15B).

The angle of recovery from 180° bending was measured for two cases: the packaging laminate film was folded over on itself with the lowermost layer in FIG. 10, 11 or 12 (leftmost layer of the layer configuration shown in Table 3 or 4) on plate 62; and the packaging laminate film was folded over on itself with the uppermost layer in FIG. 10, 11 or 12 (rightmost layer of the layer configuration shown in Table 3 or 4) on plate 62. An average of the two measurements, i.e., an angle of recovery measured when the packaging laminate film was folded over on itself with the lowermost layer in FIG. 10, 11 or 12 (leftmost layer of the layer configuration shown in Table 3 or 4) on plate 62 (or angle when the packaging laminate film was bent in left direction), and an angle of recovery measured when the packaging laminate film was folded over on itself with the uppermost layer in FIG. 10, 11 or 12 (rightmost layer of the layer configuration shown in Table 3 or 4) on plate 62 (or angle when the packaging laminate film was bent in right direction) was recorded as the angle of recovery from 180° bending.

Figure 16A:
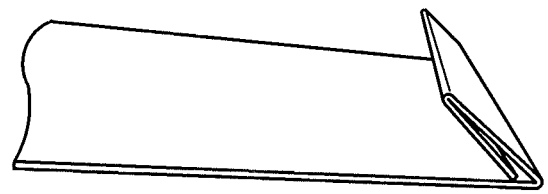
FIGS. 16A to 16C illustrate evaluation results of the closability of the packaging laminate films in Examples and Comparative Examples.
Figure 16B:
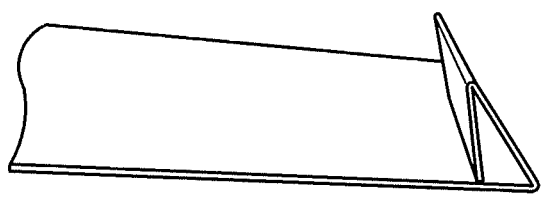
Figure 16C:
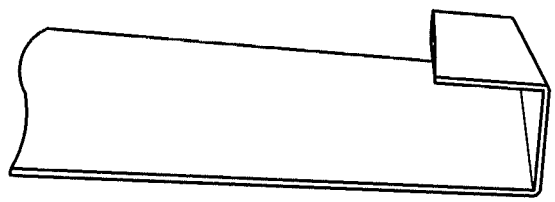

Evaluation results for Examples 3 to 8 and Comparative Examples 6 and 7 are given in Table 3, and evaluation results of Examples 9 to 12 and Comparative Example 8 in Table 4. FIGS. 16A to 16C illustrate the packaging laminate films of Example 4 and Comparative Examples 6 and 7 after releasing of the bending force in the evaluation of closability, where FIG. 16A illustrates the packaging laminate film prepared in Example 4, FIG. 16B illustrates the packaging laminate film prepared in Comparative Example 7, and FIG. 16C illustrates the packaging laminate film prepared in Comparative Example 6.

TABLE 3

| Shape-retaining film | | Structure of packaging laminate | | Evaluation results | | | |
|---|---|---|---|---|---|---|---|
| | | | Thickness | | Angle of recovery from 180° bending | | |
| | No. | Layer configuration | (μm) | Closability | Left | Right | Ave. |
| Ex. 3 | 1 | No. 1/alum./OPP/PET | 114 | Good | 65 | 50 | 57.5 |
| Ex. 4 | 1 | No. 1/alum./PET | 71 | Good | 60 | 40 | 50 |

TABLE 3-continued

| Shape-retaining film | | Structure of packaging laminate | | Evaluation results | | | |
|---|---|---|---|---|---|---|---|
| | | | Thickness | | Angle of recovery from 180° bending | | |
| | No. | Layer configuration | (μm) | Closability | Left | Right | Ave. |
| Ex. 5 | 1 | No. 1/OPP/PET | 82 | Good | 65 | 55 | 60 |
| Ex. 6 | 1 | LL/alum./No. 1/PET | 125 | Good | 65 | 50 | 57.5 |
| Ex. 7 | 1 | No. 1/alum./No1/PET | 119 | Good | 55 | 35 | 45 |
| Ex. 8 | 2 | LL/alum./No. 2 | 110 | Good | 55 | 40 | 47.5 |
| Comp. Ex. 6 | — | LL/alum./OPP/PET | 110 | Poor | 90 | 100 | 95 |
| Comp. Ex. 7 | — | LL/alum./PET | 79 | Fair | 90 | 90 | 90 |

TABLE 4

| Shape-retaining film | | Structure of packaging laminate | | Evaluation results | | | |
|---|---|---|---|---|---|---|---|
| | | | Thickness | | Angle of recovery from 180° bending (degree) | | |
| | No. | Layer configuration | (μm) | Closability | Left | Right | Ave. |
| Ex. 9 | 2 | LL/No. 2/PET | 110 | Poor | 140 | 110 | 125 |
| Ex. 10 | 3 | LL/No. 3/PET | 125 | Fair | 80 | 85 | 82.5 |
| Ex. 11 | 4 | LL/No. 4 | 102 | Fair | 120 | 90 | 105 |
| Ex. 12 | 2 | LL/No. 2 | 93 | Fair | 110 | 70 | 90 |
| Comp. Ex. 8 | — | LL/PET | 63 | Poor | 150 | 180 | 165 |

As seen from Table 3 and FIGS. 16A to 16C, the packaging laminate films prepared in Examples 3 to 8 exhibited superior closability and shape retainability (small angle of recovery) compared to those prepared in Comparative Examples 6 and 7. As seen from Table 4, the packaging laminate films prepared in Examples 9 to 12 exhibited superior shape retainability (small angle of recovery) compared to that prepared in Comparative Example 8. Comparison between Examples 9 to 12 and Comparative Example 8 reveals that the packaging laminate films that include the shape-retaining film according to the present invention exhibited relatively good shape retainability even they are free from any layer that exhibits a certain level of shape retainability, such as aluminum foil.

(3) Heat Seal Strength

The packaging laminate films prepared in Examples 4 and 7 and Comparative Example 6 were measured for heat seal strength. Specifically, the packaging laminate film was cut into 15 mm width and 120 mm length, and the packaging laminate film obtained was folded in half lengthwise and heat-sealed at the edge with a simple heat sealer ("FI-450-5W" Fuji Impulse Co., Ltd.). Heat sealing was carried out under the following conditions:

Contact area temperature (heat seal temperature): 270° C.
Contact area width: 4 mm
Preset value for impulse sealer: 10 (max)
Number of press cycles: 1 to 7

Heat seal strength at the seal was measured in accordance with JIS Z 0238. A maximum load at which the seal ruptures when the packaging laminate film is peeled at an angle of 180° on a tensile tester (Shimadzu Autograph AGS-500-D type3) at rate of 300 mm/min at 23° C. was recorded as heat seal strength.

Evaluation results for the packaging laminate films prepared in Examples 4 and 7 and Comparative Example 6 are given in Table 5. Moreover, as a reference example, an evaluation result for the single shape-retaining film is given.

TABLE 5

| | Press cycles (count) | Heat seal strength (N/15 mm) | Appearance |
|---|---|---|---|
| Ex. 4 | 1 | 13 | Good |
| | 3 | 22 | Good |
| | 5 | 15 | Largely deformed due to shrinkage |
| | 7 | 17 | Largely deformed due to shrinkage |
| Ex. 7 | 1 | 8 | |
| | 3 | 20 | Good (slightly deformed) |
| | 5 | 23 | Deformed due to shrinkage |
| | 7 | 18 | Largely deformed due to shrinkage |
| Comp. Ex. 6 | 1 | 41 | |
| Ref. Ex. 1 | 1 [note] | N.A. | Adhesion was possible, but Largely deformed due to shrinkage |

[note] preset value for impulse sealer was 5 in Reference Example.

As seen from Table 5, the packaging laminate films prepared in Examples 4 and 7 exhibited heat seal strength high enough in certain applications, yet small compared to that of the packaging laminate film prepared in Comparative Example 6.

It can be seen that because the packaging laminate film prepared in Example 4 is thin compared to that prepared in Example 7, it provided good closability with fewer press cycles. It can also be seen that the packaging laminate films prepared in Examples 4 and 7 exhibited enhanced heat seal strength by increasing the number of press cycles, but heat sealing with too large number of press cycles resulted in the deformation of the shape-retaining film due to heat shrinkage.

3. Production of Shape-Retaining Fiber (Examples 13 and 14/Comparative Examples 9 and 10)

Example 13

High density polyethylene (HI-ZEX® HZ5202(B), Prime Polymer Co., Ltd.) having an intrinsic viscosity [η] of 2.7 dl/g was melt-kneaded in an extruder at 260° C., and extruded from a T-die to prepare a 500 μm-thick original film. Physical properties of HI-ZEX are as follows: density=965 kg/m³, molecular weight distribution (weight-average molecular weight (Mw)/number-average molecular weight (Mn)))= 11.3, melt flow index at 190° C.=0.34 g/10 min.

The original film thus obtained was uniaxially stretched at a stretch ratio of 20 while heating it with a heating roll at 120° C. to prepare a 27 μm-thick uniaxially stretched film.

The uniaxially stretched film was fed into in the stretch direction into a micro slitter equipped with a rotary shear (blade) and cut into fibers along the stretch direction. The slit width of the rotary shear was set to 0.64 mm or 0.36 mm. The short side of a rectangular cross-section of fiber was 27 with the long side being 640 μm or 360 μm. The obtained two sets of fibers were approximately 140 denier and approximately 78 denier, respectively.

Example 14

A 40 μm-thick uniaxially stretched film was prepared in the same manner as in Example 13 except that the original film was made 900 μm in thickness and stretched at a stretch ratio of 24 while heating it to 120° C. under radiation of the near infrared light spectrum. As in Example 13, using a micro slitter, the uniaxially stretched film was cut into fibers that have a rectangular cross-section. The short side of a rectangular cross-section of fiber was 40 μm, with the long side being 640 μM or 360 μm.

Comparative Example 9

A 60 μm-thick uniaxially stretched film was prepared by uniaxially stretching the original film prepared in Example 13 at a stretch ratio of 10 while heating it with a heating roll to 120° C. As in Example 13, using a micro slitter, the uniaxially stretched film was cut into fibers that have a rectangular cross-section, the short side of which was 60 μM with the long side being 640 μm or 360 μm.

Comparative Example 10

A 35 μm-thick uniaxially stretched film was prepared by uniaxially stretching the original film prepared in Example 13 at a stretch ratio of 15 while heating it with a heating roll to 120° C. As in Example 13, using a micro slitter, the uniaxially stretched film was cut into fibers that have a rectangular cross-section, the short side of which was 35 μm with the long side being 640 μm or 360 μm.

The stretched films (before cutting) prepared in these Examples and Comparative Examples were measured for tensile elasticity modulus, angle of recovery from 90° bending, and thermal conductivity.

1) Tensile Elasticity Modulus

The tensile elasticity modulus of the stretched films was measured in accordance with JIS K7161 described above.

2) Angle of Recovery from 90° Bending

The angle of recovery from 90° bending was measured for the stretched films in the same manner as that for the above-described shape-retaining films.

3) Thermal Conductivity

The uniaxially stretched film was cut into a strip which is 30 mm in length (stretch direction) and 3 mm in width, followed by deposition of a light-receiving film (thin Bi film, thickness: approximately 1,000Å) on one side of the strip to prepare a test sample. The test sample was measured for thermal diffusivity α(m²/s) at 25° C. with a thermal diffusivity meter using the AC calorimetric method ("LaserPIT" ULVAC-RIKO, Inc.). On the other hand, the sheet was measured for specific heat Cp (J/(kg K) and density ρ (kg/m³) by differential scanning calorimetry. The measured values were substituted into the following equation to find thermal conductivity (unit: W/mK):

$$\text{Thermal conductivity } \lambda = \alpha \times \rho \times Cp$$

TABLE 6

|  |  | Ex. 13 | Ex. 14 | Comp. Ex. 9 | Comp. Ex. 10 |
|---|---|---|---|---|---|
| Film material |  | HD-PE | HD-PE | HD-PE | HD-PE |
| Manufacturing condition | Stretch ratio (x fold) | 20 | 24 | 10 | 15 |
|  | Heating method | Roll heating | Radiation heating | Roll heating | Roll heating |
| Evaluation | Thickness (μm) | 27 | 40 | 60 | 35 |
|  | 1) Tensile elasticity modulus (GPa) | 20 | 28 | 7 | 14 |
|  | 2) Angle of recovery from 90° bending (°) | 5 | 3 | 28 | 10 |
|  | 3) Thermal conductivity (W/mK) | 10 | 12 | 5 | 7 |

As demonstrated in Examples 13 and 14, the uniaxially stretched films stretched at a stretch ratio of not less than 20 exhibited high tensile elasticity modulus and small angle of recovery from bending, whereas as demonstrated in Comparative Examples 9 and 10 the uniaxially stretched films stretched at a stretch ratio of less than 20 exhibited small tensile elasticity modulus and large angle of recovery from bending. Moreover, the shape-retaining fibers prepared in Examples 13 and 14 were elastic enough to be able to be woven into a fabric.

It can also be seen that the shape-retaining fibers prepared in Examples 13 and 14 exhibited high thermal conductivity compared to those prepared in Comparative Examples 9 and 10.

4. Evaluation of Anisotropic Heat-Conductive Films (Examples 15 and 16/Comparative Examples 11 and 12)

Example 15

High density polyethylene (HI-ZEX® HZ5202(B), Prime Polymer Co., Ltd.; density=965 kg/m³, weight-average molecular weight (Mw)/number-average molecular weight (Mn)=11.3, melt flow index at 190° C.=0.34 g/10 min) was melt-kneaded in an extruder at 260° C., and extruded from a T-die to prepare a 900 μm-thick original film.

The original film was uniaxially stretched at a stretch ratio of 24 while heating it to 120° C. under light of the near infrared light spectrum to prepare a 40 μm-thick uniaxially stretched film.

Example 16

An original film was prepared in the same manner as in Example 15 except that the thickness of the original film was adjusted to 500 μm. A 35 μm-thick uniaxially stretched film was prepared in the same manner as in Example 15 except that the original film was stretched at a stretch ratio of 15 while heating it to 120° C. with a heating roll.

Comparative Example 11

A 500 μm-thick film was prepared in the same manner as in Example 15 except that the original film prepared in Example 15 was not stretched.

Comparative Example 12

A 1,000 μm-thick heat dissipation rubber sheet ("TC-100THS" Shin-Etsu Chemical Co., Ltd.; low-hardness silicone rubber sheet) was prepared.

The films prepared in Examples 15 and 16 and Comparative Examples 11 and 12 were measured for 1) tensile elasticity modulus in X and Y directions; 2) angle of recovery from 90° bending; 3) thermal conductivity; and 4) in-plane heat conduction behavior.

1) Tensile Elasticity Modulus
1-1) Tensile Elasticity Modulus in X Direction (Film Stretch Direction)

The film was cut into a strip test specimen which is 10 mm in width (dimension in the direction perpendicular to the film stretch direction; Y direction) and 120 mm in length (dimension in the film stretch direction; X direction). This test specimen was then measured for tensile elasticity modulus in X direction (film stretch direction) in accordance with JIS K7161 using a tensile tester under the following condition: chuck-to-chuck distance=100 mm, tensile rate=100 mm/min. Tensile elasticity modulus was measured for 5 other samples, and an average was calculated to find tensile elasticity modulus in X direction (film stretch direction). The measurements of tensile elasticity modulus were made at 23° C. and 55% humidity.

1-2) Tensile Elasticity Modulus in Y Direction (Direction Perpendicular to Film Stretch Direction)

Tensile elasticity modulus was measured in the same manner as in above 1-1) except that the film was cut into a strip test specimen which is 10 mm in width (dimension in the film stretch direction; X direction) and 120 mm in length (dimension in the direction perpendicular to the film stretch direction; Y direction), and that the test specimen was stretched in Y direction.

2) Angle of Recovery from 90° Bending

The uniaxially stretched film was cut into a test specimen which is 10 mm in width (dimension in the direction perpendicular to the film stretch direction; Y direction) and 50 mm in length (dimension in film stretch direction; X direction). In the same manner as described above, an angle of recovery from 90° bending was measured by bending test specimen 10 lengthwise (X direction) about an axis parallel to Y direction so as to be pressed against a right-angled corner (two intersecting surfaces 12A and 12B) of steel article 12, releasing the bending force so as to allow test specimen 10 to be separated from surface 12B, and measuring the angle between test specimen 10 and surface 12B.

3) Thermal Conductivity
3-1) Thermal Conductivity in X Direction

The uniaxially stretched film was cut into a strip sample which is 30 mm in length (film stretch direction; X direction) and 3 mm in width (dimension in the direction perpendicular to the film stretch direction; Y direction), followed by deposition of a light-receiving film (thin Bi film, thickness: approximately 1,000 Å) on one side of the strip sample to prepare a test sample. The test sample was measured for thermal diffusivity $\alpha(m^2/s)$ in lengthwise direction (X direction) at 25° C. with a thermal diffusivity meter using the AC calorimetric method ("LaserPIT" ULVAC-RIKO, Inc.). On the other hand, the strip sample was measured for specific heat Cp (J/(kg K) and density $\rho(kg/m^3)$ by differential scanning calorimetry. The measured values were substituted into the following equation to find thermal conductivity $\lambda$(W/mK):

$$\text{Thermal conductivity } \lambda = \alpha \times \rho \times Cp$$

3-2) Thermal Conductivity in Y Direction

Thermal conductivity in Y direction of the anisotropic heat-conductive film was measured in the same manner as described above except that, aside from the strip sample prepared in above 1), the anisotropic heat-conductive film was cut into a strip sample which is 30 mm in length (dimension in the direction perpendicular to the film stretch direction; Y direction) and 3 mm in width (dimension in film stretch direction; X direction), and thermal conductivity in lengthwise direction (Y direction) was measured for the sample.

The ratio of thermal conductivity in X direction measured in above 3-1) to thermal conductivity in Y direction measured in 3-2) was calculated.

4) In-Plane Heat Conduction Behavior

Figure 17A:
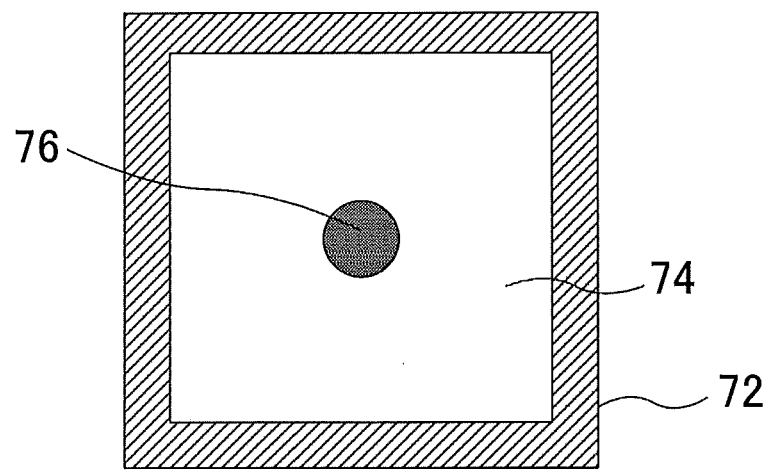
FIGS. 17A and 17B illustrate an example of an in-plane heat conduction behavior meter in Examples/Comparative Examples.
Figure 17B:
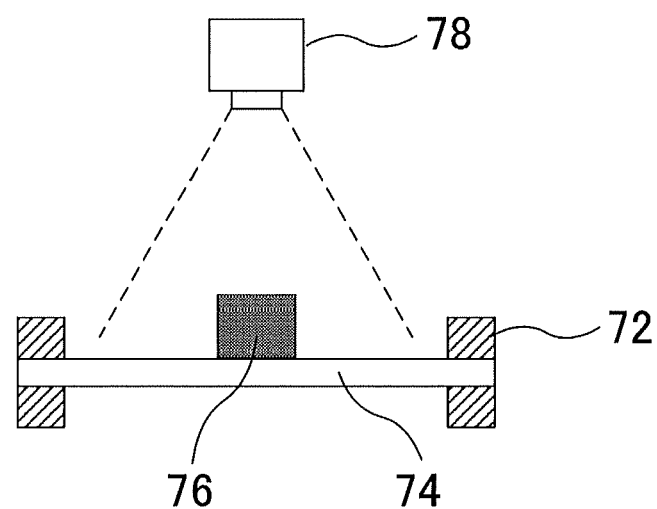

FIGS. 17A and 17B illustrate an example of an in-plane heat conduction behavior meter. As illustrated in FIG. 17A, steel frame 72 measuring 30 cm×30 cm on the inside was provided. Next, test film 74 (uniaxially stretched film) was stretched across frame 72 and secured. Columnar aluminum article 76 (approximately 13 g in weight) measuring 30 mm in diameter and 7 mm in height, heated to 100° C. in an oven, was then placed on the center of the test film secured to frame 72. In a constant temperature room (23° C.), using thermography TP-L (CHINO Corp., denoted as reference sign 78 in FIG. 17B), heat accumulation was measured 30 seconds, 60 seconds, 90 seconds and 120 seconds after placement of the aluminum article, at a position 35 cm above the center of the surface of test film 74. The dynamic temperature range was set to from 30° C. to 33° C., and temperature changes within this temperature range were recorded as images. Areas that showed even a slight color change from the color corresponding to 30° C. were deemed as areas where heat are apparently conducted and accumulated (apparent heat accumulation area).

The ratio of lengthwise dimension l (dimension in X direction) to widthwise dimension w (dimension in Y direction) of the apparent heat accumulation area, the l/w ratio, was found 30 seconds, 60 seconds, 90 seconds and 120 seconds after placement of the aluminum article.

Evaluation results for Examples 15 and 16 and Comparative Examples 11 and 12 are given in Table 7. In Table 7, values of l/W are measured 120 seconds after placement of the aluminum article. Thermograms of in-plane heat conduction behavior are given in FIGS. 18A to 18D. Evaluation results for Examples 15 and 16 and Comparative Examples 11 and 12 are given in FIGS. 18A to 18D, respectively. In these drawings vertical direction corresponds to the stretch direction (X direction) of the uniaxially stretched film, and horizontal direction to the direction perpendicular to the stretch direction (Y direction). A graph that plots aspect ratio (l/w) of apparent heat accumulation area vs. elapsed time is given in FIG. 19.

TABLE 7

| | | Ex. 15 | Ex. 16 | Comp. Ex. 11 | Comp. Ex. 12 |
|---|---|---|---|---|---|
| Film material | | HD-PE | HD-PE | HD-PE | Heat dissipation rubber |
| Manufacturing condition | Stretch ratio (x fold) | 24 | 15 | 1 | 1 |
| | Heating method | Radiation heating | Roll heating | Roll heating | — |
| Results | Thickness (μm) | 40 | 35 | 500 | 1000 |
| | 1-1) Tensile elasticity modulus in X direction (GPa) | 28 | 14 | 1.5 | 0.3 |
| | 1-2) Tensile elasticity modulus in Y direction (GPa) | 4.0 | 3.3 | 1.2 | 0.3 |
| | 2) Angle of recovery from 90° bending @25° C. (°) | 3 | 10 | 80 | 90 |
| | 3-1) Thermal conductivity in X direction (W/mK) | 10.8 | 7.4 | 0.4 | 2.5 |
| | 3-2) Thermal conductivity in Y direction (W/mK) | 0.2 | 0.2 | 0.4 | 2.5 |
| | Ratio of thermal conductivity between X and Y directions | 54 | 37 | 1 | 1 |
| | 4) 1/W @120 seconds later | 1.85 | 1.74 | 0.95 | 0.90 |

As seen from Table 7, the tensile elasticity modulus of the films prepared in Examples 15 and 16 greatly varied between directions X and Y (stretch direction and direction perpendicular to the stretch direction), whereas the tensile elasticity modulus of the non-oriented film prepared in Comparative Example 11 and heat dissipation rubber sheet prepared in Comparative Example 12 was almost the same between directions X and Y.

Accordingly, it can be seen that the films prepared in Examples 15 and 16 exhibited large ratios of thermal conductivity between X and Y directions (i.e., high anisotropy in thermal conductivity) compared to the films prepared in Comparative Examples 11 and 12. It was also demonstrated that the films prepared in Examples 15 and 16 exhibited small angles of recovery from bending about an axis parallel to Y direction (i.e., high shape retainability) compared to the films prepared in Comparative Examples 11 and 12.

Figure 18:
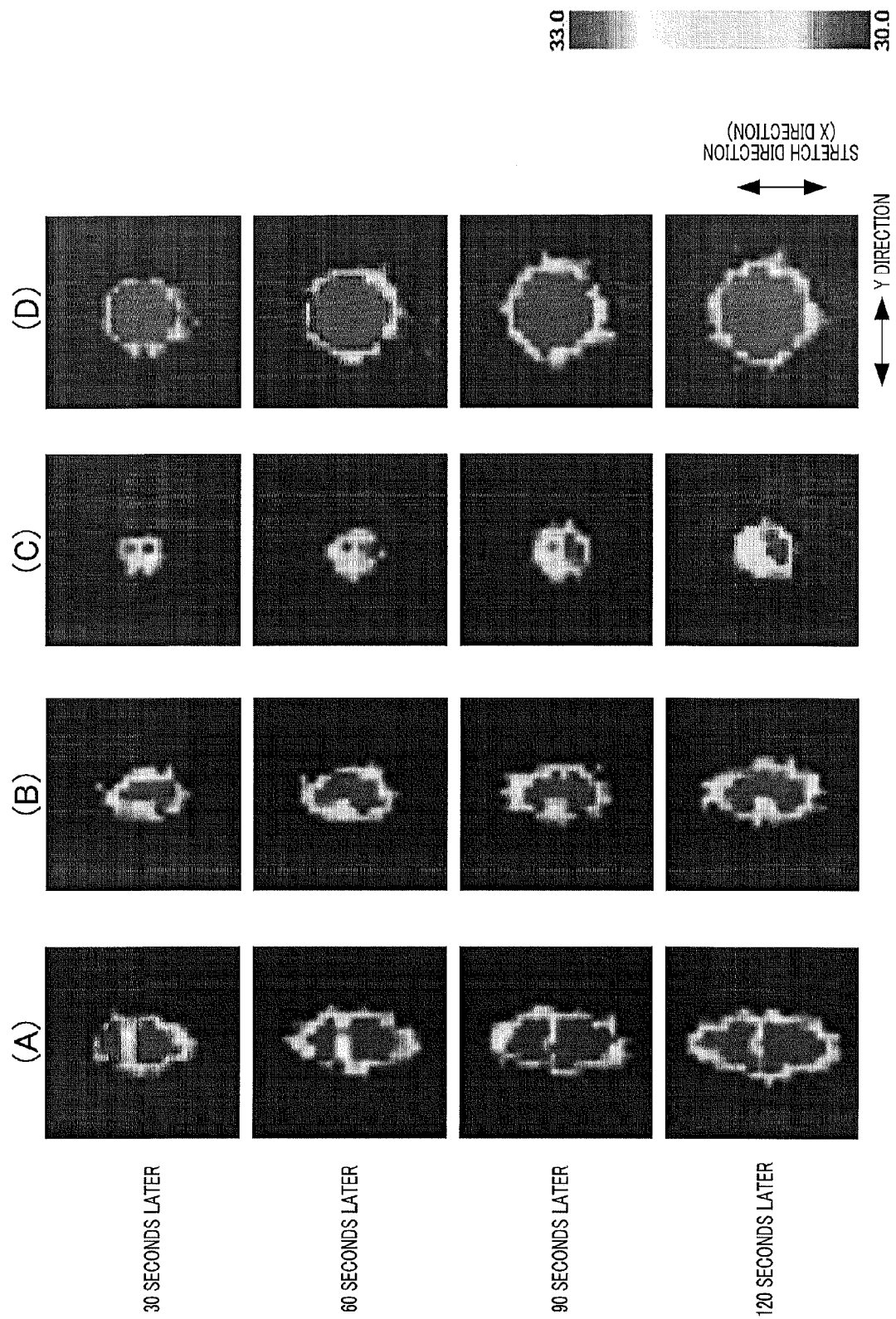
FIGS. 18A to 18D show heat conduction behaviors for the anisotropic heat-conductive films in Examples/Comparative Examples.

In FIGS. 18A to 18D, the temperature of the deep-colored area in the background is 30° C. A deep-colored area at the center has a temperature of 33° C., and a light-colored area at the center has a temperature ranging from 30° C. to 33. FIGS. 18A to 18D each show that heat is conducting from the center toward the periphery. It can be seen that the films prepared in Examples 15 and 16 exhibit anisotropic thermal conductance (see FIGS. 18A and 18B), whereas the films Comparative Examples 11 and 12 exhibit no thermal conductance (FIG. 18C) or isotropic thermal conductance (FIG. 18D).

Figure 19:
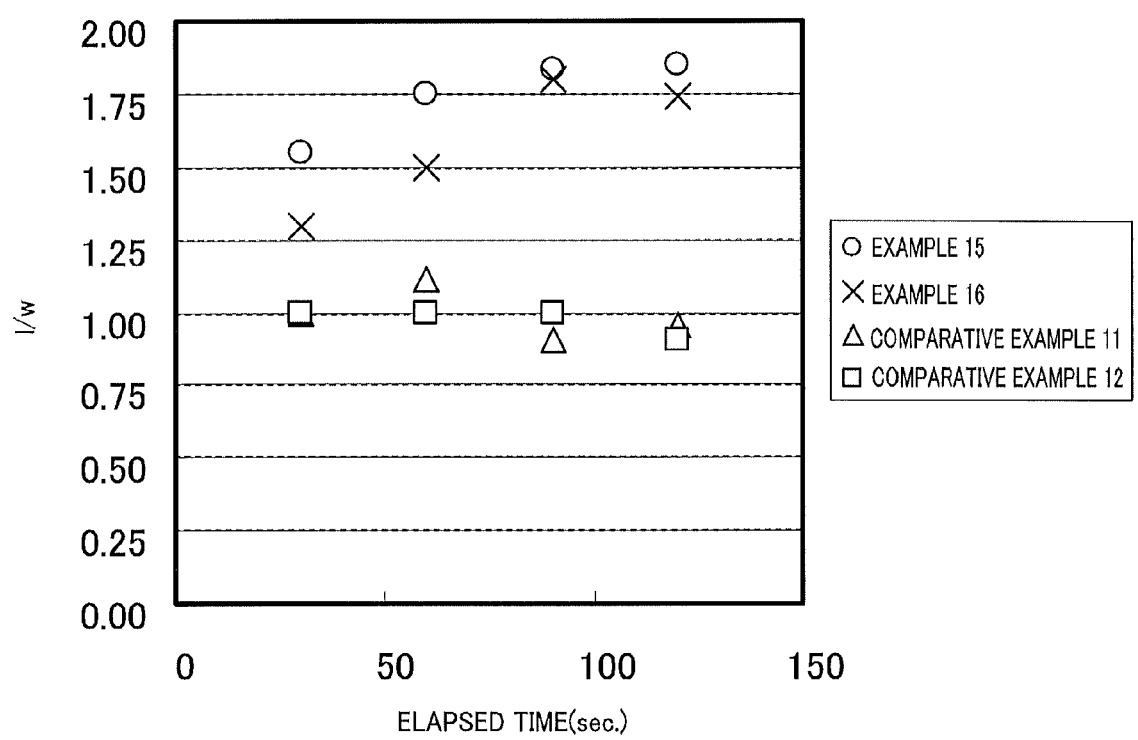
FIG. 19 is a graph of aspect ratio (I/W) of apparent heat accumulation area versus elapsed time in Examples/Comparative Examples.

As shown in FIG. 19, it is suggested that under the measurement condition used here (heat source temperature: 100° C., surrounding temperature: 23° C.) an increase in the value of l/w for the films prepared in Examples 15 and 16 was almost saturated (i.e., heat is less likely to be conducted any longer) 90 to 120 seconds after placement of the aluminum article.

Smaller values of aspect ratio (l/w) of heat accumulation area as measured in the procedure in 4) relative to values of thermal conductivity ratio between X and Y directions as measured in the procedure in 3) above are considered to be due to significant influence of heat dissipation from the film in the case of the measurement condition (heat source temperature and surrounding temperature) used in 4). For this reason, it is suggested that when the anisotropic heat-conductive film is to be used under the condition similar to the one used for measurement of in-plane heat conduction behavior, it is only necessary that dimension L1 (dimension in X direction) and dimension W1 (dimension in Y direction) of the film be determined at least based on the value of l/w measured 120 seconds after placement of the aluminum article.

The application is entitled to and claims the priority of Japanese Patent Application No. 2010-105362 filed on Apr. 30, 2010, Japanese Patent Application No. 2010-105363 filed on Apr. 30, 2010, Japanese Patent Application No. 2010-121944 filed on May 27, 2010, Japanese Patent Application No. 2010-136443 filed on Jun. 15, 2010, Japanese Patent Application No. 2010-136326 filed on Jun. 15, 2010, and Japanese Patent Application No. 2011-27465 filed on Feb. 10, 2011, the contents of which including the claims, specification, drawings and abstract are herein incorporated by reference in their entirety.

INDUSTRIAL APPLICABILITY

The present invention can provide a shape-retaining film that exhibits high shape retainability as well as superior adhesion to ink.

The present invention can provide a packaging laminate film that exhibits high shape retainability and a packaging material including the same, using a relatively simple production process. They are thus suitable as packaging materials for retort foods, snacks and other foods and packaging materials for detergents and other agents, as well as packaging materials for refills. Moreover, elimination of aluminum foil renders them suitable as packaging materials for microwave oven cooking.

The shape-retaining fiber according to the present invention exhibits superior shape retainability as well as elasticity enough for it to be woven into a fabric. Moreover, since the shape-retaining fiber according to the present invention exhibits high thermal conductivity, it is possible to confer superior heat dissipation to a fabric made of the fiber, making it suitable a clothing fabric.

The present invention can provide an anisotropic heat-conductive film that exhibits good thermal conductivity as well as good flexibility and shape retainability.

| Reference Signs List | |
|---|---|
| 10 | Test specimen |
| 12 | Steel article |
| 12A | One surface of (right-angled corner) |
| 12B | Other surface of (right-angled corner) |
| 20 | Packaging laminate film |
| 22 | Shape-retaining Film |
| 24 | Aluminum foil layer |
| 26 | Protection layer |
| 30 | Packaging material |
| 30A | Opening (of packaging material) |
| 40 | Heat dissipation device |
| 42 | Heat source |
| 44, 54, 54A, 54B | Anisotropic heat-conductive film |
| 46, 56 | Heat dissipator |

| Reference Signs List | |
|---|---|
| 50, 50' | Heat dissipation structure |
| 51 | Printed circuit board |
| 52, 52A, 52B, 52C, 52D | Heat source |
| 60 | Test specimen |
| 62 | Plate |
| 62A | Top surface (of plate) |
| 72 | Frame |
| 74 | Test film |
| 76 | Aluminum article |
| 78 | Thermography |

The invention claimed is:

1. A shape-retaining film comprising an ethylene homopolymer or a ethylene/$C_{3-6}$ α-olefin copolymer having α-olefin unit content of less than 2 wt %, the ethylene homopolymer and ethylene/$C_{3-6}$ α-olefin copolymer each having a density of 950 kg/m$^3$ or more and a ratio of weight-average molecular weight (Mw) to number-average molecular weight (Mn) of 5 to 20, wherein
the shape-retaining film has a tensile elasticity modulus of 16 to 50 GPa, and exhibits an angle of recovery from 90° bending of 8° or less or an angle of recovery from 180° bending of 65° or less, and
the shape-retaining film has a surface roughness of Ra of 0.17 to 0.23 μm and surface projection interval of Sm of 50 to 180 μm.

2. The shape-retaining film according to claim 1, wherein the tensile elasticity modulus is 20 to 50 GPa.

3. The shape-retaining film according to claim 1, wherein the shape-retaining film has a thickness of 20 to 100 μm.

4. A process for producing the shape-retaining film according to claim 1, comprising:
obtaining an original film containing an ethylene homopolymer or a ethylene/$C_{3-6}$ α-olefin copolymer having α-olefin unit content of less than 2 wt %, the ethylene homopolymer and ethylene/$C_{3-6}$ α-olefin copolymer each having a density of 940 kg/m$^3$ or more and a ratio of weight-average molecular weight (Mw) to number-average molecular weight (Mn) of 5 to 20; and
stretching the original film at a stretch ratio of 10 to 30.

5. A packaging laminate film comprising the shape-retaining film according to claim 1.

6. The packaging laminate film according to claim 5, where an angle of recovery from 180° bending for the packaging laminate film is 110° or less.

7. The packaging laminate film according to claim 5, further comprising at least one layer selected from the group consisting of aluminum layer, protection layer, and heat seal layer.

8. A packaging material constituted by the packaging laminate film according to claim 5, wherein some edges of the packaging laminate film is sealed, and an opening plane of the packaging material intersects stretch direction of the shape-retaining film included in the packaging laminate film.

9. The packaging material according to claim 8, wherein the opening plane of the packaging material substantially perpendicularly intersects the stretch direction of the shape-retaining film included in the packaging laminate film.

10. A process for producing a packaging material comprising:
obtaining the packaging laminate film according to claim 5;
overlaying the packaging laminate film on itself or on another sheet to produce a laminate; and
sealing some edges of the laminate produced.

* * * * *